(12) United States Patent
Koh et al.

(10) Patent No.: US 11,937,477 B2
(45) Date of Patent: Mar. 19, 2024

(54) DISPLAY DEVICE AND ELECTRONIC APPARATUS

(71) Applicant: Samsung Display Co., Ltd., Yongin-si (KR)

(72) Inventors: Eunkyung Koh, Yongin-si (KR); Seungin Baek, Yongin-si (KR); Sanggu Lee, Yongin-si (KR); Daewook Kim, Yongin-si (KR); Byongug Park, Yongin-si (KR); Hyunjin Son, Yongin-si (KR); Jewon Yoo, Yongin-si (KR); Sujin Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/303,739

(22) Filed: Apr. 20, 2023

(65) Prior Publication Data

US 2023/0269982 A1 Aug. 24, 2023

Related U.S. Application Data

(63) Continuation of application No. 17/036,590, filed on Sep. 29, 2020, now Pat. No. 11,653,534.

(30) Foreign Application Priority Data

Mar. 5, 2020 (KR) ........................ 10-2020-0027982

(51) Int. Cl.
*H10K 59/131* (2023.01)
*H04N 23/57* (2023.01)
(Continued)

(52) U.S. Cl.
CPC ........... *H10K 59/131* (2023.02); *H10K 59/00* (2023.02); *H10K 59/12* (2023.02); *H10K 59/121* (2023.02);
(Continued)

(58) Field of Classification Search
CPC ...... H10K 59/131; H10K 59/00; H10K 59/12; H10K 59/121; H10K 59/126; H10K 59/352; H04N 23/57
See application file for complete search history.

(56) References Cited

U.S. PATENT DOCUMENTS 8,052,278 B2 11/2011 Bovet et al.
9,143,668 B2 9/2015 Mathew et al.
(Continued)

FOREIGN PATENT DOCUMENTS

JP 5643173 12/2014
JP 2018-528450 9/2018
(Continued)

OTHER PUBLICATIONS

Alireza Makhzani et al., "Adversarial Autoencoders", arXiv:1511.05644v2 [cs,LG] May 25, 2016, pp. 1-16.
(Continued)

*Primary Examiner* — David Vu
*Assistant Examiner* — Brandon C Fox
(74) *Attorney, Agent, or Firm* — KILE PARK REED & HOUTTEMAN PLLC

(57) ABSTRACT

A display device includes pixel circuits disposed on a substrate, each of the pixel circuits comprising a transistor and a storage capacitor, display elements electrically connected to the pixel circuits, and a metal layer disposed between the substrate and the pixel circuits, the metal layer comprising through-holes, wherein the through-holes of the metal layer include a first through-hole, and a second through-hole disposed adjacent to the first through-hole.

20 Claims, 25 Drawing Sheets

(51) Int. Cl.
*H10K 59/00* (2023.01)
*H10K 59/12* (2023.01)
*H10K 59/121* (2023.01)
*H10K 59/126* (2023.01)
*H10K 59/35* (2023.01)

(52) U.S. Cl.
CPC ......... *H10K 59/126* (2023.02); *H10K 59/352* (2023.02); *H10K 59/353* (2023.02); *H04N 23/57* (2023.01)

(56) References Cited

U.S. PATENT DOCUMENTS

| | | |
|---|---|---|
| 10,102,789 B2 | 10/2018 | Evans, V et al. |
| 10,295,451 B2 | 5/2019 | Schneider et al. |
| 2020/0058247 A1 | 2/2020 | Zhang et al. |
| 2020/0124927 A1* | 4/2020 | Kim ................... H10K 50/822 |
| 2020/0212135 A1 | 7/2020 | Zhang |
| 2020/0273934 A1* | 8/2020 | You ........................ G06F 3/041 |
| 2021/0050403 A1* | 2/2021 | Lee ...................... H10K 59/121 |
| 2021/0117639 A1 | 4/2021 | Yang et al. |
| 2021/0159286 A1* | 5/2021 | Ma ....................... H10K 59/126 |
| 2021/0257594 A1 | 8/2021 | Kim et al. |
| 2021/0408194 A1 | 12/2021 | Zhang |

FOREIGN PATENT DOCUMENTS

| | | |
|---|---|---|
| KR | 10-1367274 | 2/2014 |
| KR | 10-1653923 | 9/2016 |

OTHER PUBLICATIONS

Richard S. Sutton et al., "Reinforcement Learning: An Introduction", Robotica, 1999, pp. 229-230, vol. 17, 1st ed. MIT Press, Cambridge.

\* cited by examiner

DISPLAY DEVICE AND ELECTRONIC APPARATUS

CROSS-REFERENCE TO RELATED APPLICATION(S)

This is a continuation application of U.S. patent application Ser. No. 17/036,590, filed Sep. 29, 2020 (now pending), the entire contents of which are incorporated herein by reference. U.S. patent application Ser. No. 17/036,590 claims priority to and benefits of Korean Patent Application No. 10-2020-0027982 under 35 U.S.C. § 119, filed in the Korean Intellectual Property Office on Mar. 5, 2020, the entire contents of which is incorporated herein by reference for all purposes.

BACKGROUND

1. Technical Field

Embodiments of the disclosure relate to a display device and an electronic apparatus including the display device.

2. Description of the Related Art

Display devices have been widely used. Furthermore, as the thickness and weight of a display device have been reduced, a use range thereof has been increased.

As the area of a display area in a display device has been increased, various functions combined or linked to a display device have been added. As a method to add various functions while increasing display area, research has been conducted into a display device having an area for both adding various functions and displaying an image.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

In order to add various functions, a component such as a camera or a sensor may be disposed. A component may be disposed to overlap a display area to secure a larger display area. As a method of displaying a component, a display device may include a transmission area in which a wavelength such as light or sound may be transmitted.

Additional aspects will be set forth in part in the description which follows and, in part, will be apparent from the description, or may be learned by practice of the presented embodiments of the disclosure.

According to an embodiment of the disclosure, a display device may include pixel circuits disposed on a substrate, each of the pixel circuits comprising a transistor and a storage capacitor, display elements electrically connected to the pixel circuits, and a metal layer disposed between the substrate and the pixel circuits, the metal layer comprising through-holes, wherein the through-holes of the metal layer may include a first through-hole and a second through-hole disposed adjacent to the first through-hole.

The metal layer may include a metal part between the first through-hole and the second through-hole, and the metal part may overlap the pixel circuits and the display elements.

The first through-hole may have a shape, a size, or a width which is different from that of the second through-hole.

At least one of the first through-hole and the second through-hole may include corner parts disposed in different directions from a center.

At least one of the first through-hole and the second through-hole may include a side edge between adjacent corner parts, and the side edge may be curved.

The side edge may include an uneven part.

The first through-hole may include four corner parts disposed in four different directions from a first center, the second through-hole may include four corner parts disposed in four different directions from a second center, and one or more corner parts of the first through-hole and one or more corner parts of the second through-hole may be adjacent to each other.

The first through-hole may entirely surround the second through-hole.

At least one of the first through-hole and the second through-hole may include protruding portion.

The metal layer may further include a fine hole disposed between the first through-hole and the second through-hole.

According to another embodiment of the disclosure, an electronic apparatus may include a display device including at least one transmission area, and a component disposed below the at least one transmission area, wherein the display device may include pixel circuits disposed on a substrate, each of the pixel circuits including a transistor and a storage capacitor, display elements electrically connected to the pixel circuits, and a metal layer disposed between the substrate and the pixel circuits, the metal layer including a first through-hole and a second through-hole.

The metal layer may include a metal part between the first through-hole and the second through-hole, and the metal part may overlap the pixel circuits and the display elements.

The metal part may include a fine hole.

An edge of at least one of the first through-hole and the second through-hole may include an uneven part.

At least one of the first through-hole and the second through-hole may include four corner parts disposed in four different directions from a center, and a curved side edge may be between two neighboring corner parts of the four corner parts.

At least one of the first through-hole and the second through-hole may include a fine concave portion or a fine protruding portion.

Each of the first through-hole and the second through-hole may include four corner parts, and the first through-hole and the second through-hole may be arranged such that at least one of the corner parts of the first through-hole and at least one of the corner parts of the second through-hole may be adjacent to each other.

The first through-hole may entirely surround the second through-hole.

A width of the first through-hole may be about 200 μm to about 300 μm.

The component may include at least one of a sensor and a camera.

The above and other aspects, features, and advantages of certain embodiments of the disclosure will be more apparent from the following description, the accompanying drawings, and claims.

BRIEF DESCRIPTION OF THE DRAWINGS

The above and other aspects, features, and advantages of certain embodiments of the disclosure will be more apparent

DETAILED DESCRIPTION OF THE EMBODIMENTS

Figure 1A:
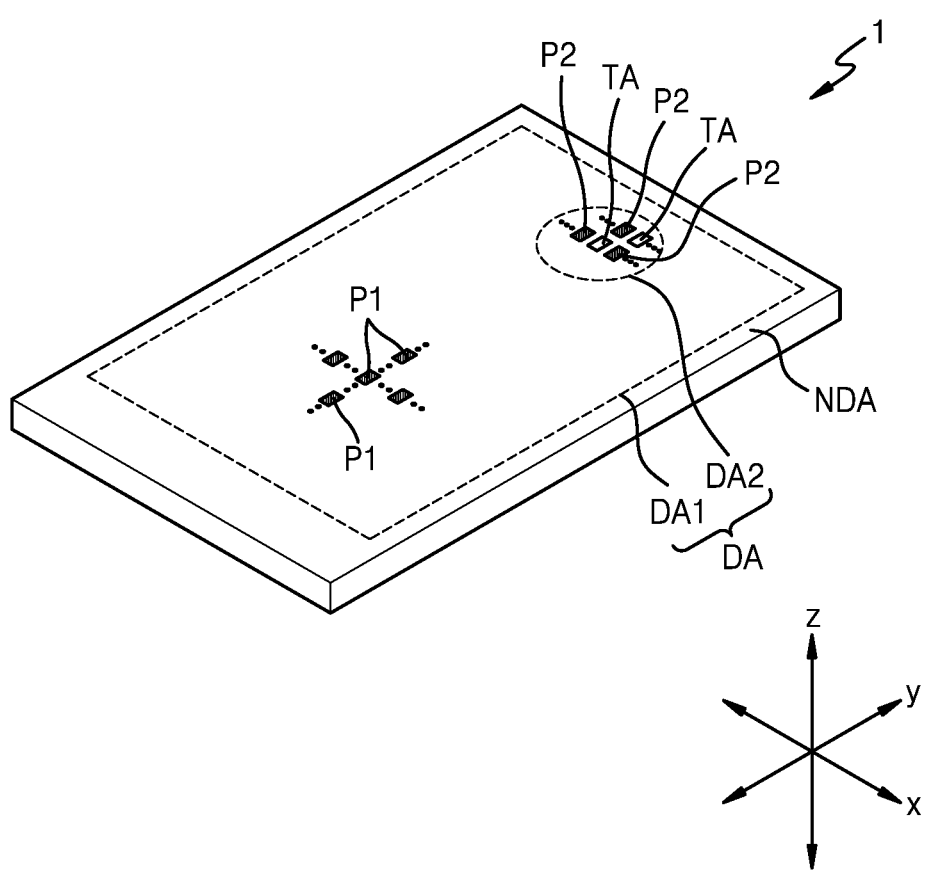
FIGS. 1A and 1B are schematic perspective views of an electronic apparatus according to an embodiment of the disclosure.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description. As used herein, the term "and/or" includes any and all combinations of one or more of the associated listed items. The terms "and" and "or" may be used in the conjunctive or disjunctive sense and may be understood to be equivalent to "and/or." Throughout the disclosure, the expression "at least one of a, b and c" indicates only a, only b, only c, both a and b, both a and c, both b and c, all of a, b, and c, or variations thereof.

Hereinafter, the disclosure will be described in detail by explaining embodiments of the disclosure with reference to the attached drawings, and in the description of the disclosure, certain detailed explanations of related art are omitted when it is deemed that they may unnecessarily obscure the essence of the disclosure.

While such terms as "first," "second," etc., may be used to describe various components, such components must not be limited to the above terms. The above terms are used only to distinguish one component from another.

An expression used in the singular encompasses the expression of the plural, unless it has a clearly different meaning in the context.

Terms such as "including," "having," and "comprising" are intended to indicate the existence of the features disclosed in the specification, and are not intended to preclude the possibility that one or more other features may exist or may be added.

Spatially relative terms such as "below", "beneath", "lower", "behind" "above", "upper", or "in front" or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, elements positioned "below" or "behind" another device may be placed "above" or "in front" of another device. Accordingly, the illustrative term "below" may include both the lower and upper positions. The device may also be oriented in other directions and thus the spatially relative terms may be interpreted differently depending on the orientations.

It will be understood that when a component, such as a layer, a film, a region, or a plate, is referred to as being "on" another component, the component can be directly on the other component or intervening components may be present thereon.

Sizes of components in the drawings may be exaggerated for convenience of explanation. For example, as sizes and thicknesses of components in the drawings may be arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being "connected to" another layer, region, or component, it can be directly connected to the other layer, region, or component or indirectly connected to the other layer, region, or component via intervening layers, regions, or components. For example, in the specification, when a layer, region, or component is referred to as being electrically connected to another layer, region, or component, it can be directly electrically connected to the other layer, region, or component or indirectly electrically connected to the other layer, region, or component via intervening layers, regions, or components.

Terms such as "overlap" may include layer, stack, face or facing, extending over, extending under, covering or partly covering or any other suitable term as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Figure 1B:
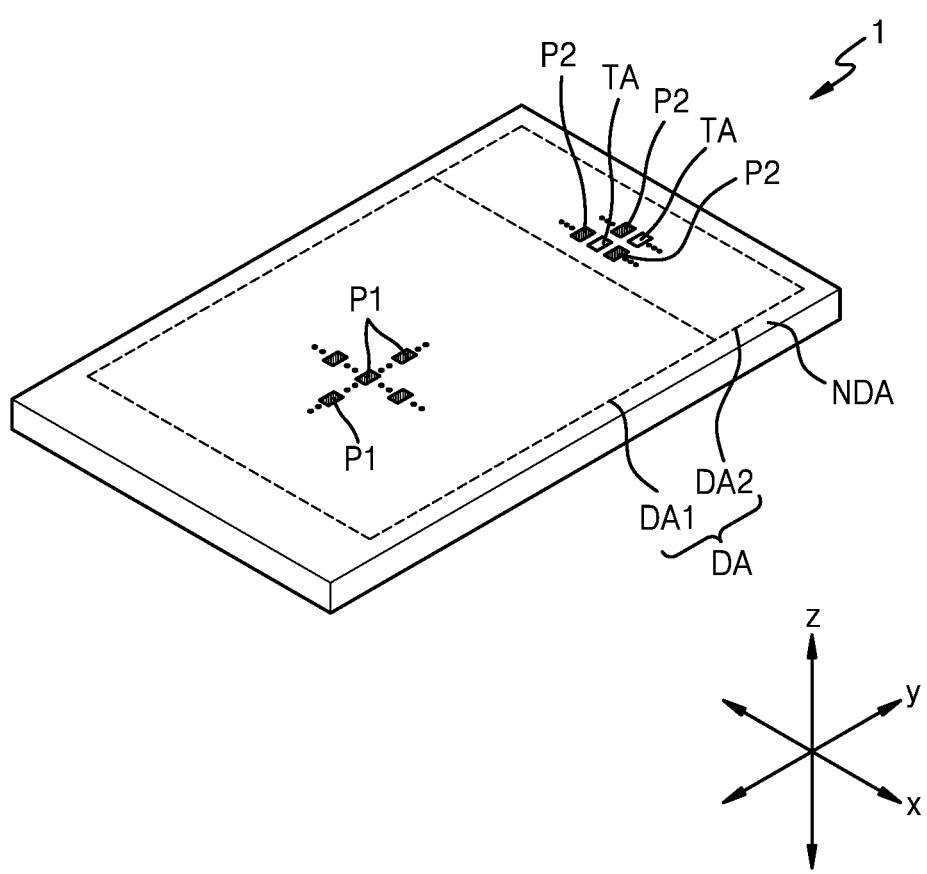

FIGS. 1A and 1B are schematic perspective views of an electronic apparatus 1 according to an embodiment of the disclosure.

Referring to FIGS. 1A and 1B, the electronic apparatus 1 may include a display area DA and a non-display area NDA outside the display area DA. The electronic apparatus 1 may provide an image through an array of pixels that may be two-dimensionally arranged in the display area DA. Pixels may include first pixels P1 disposed in a first display area DA1 and second pixels P2 disposed in a second display area DA2.

The electronic apparatus 1 may provide a first image by using light emitted from the first pixels P1 disposed in the first display area DA1 and a second image by using light emitted from the second pixels P2 disposed in the second display area DA2. In some embodiments, the first image and the second image may be parts of any one image provided through the display area DA of the electronic apparatus 1. In some embodiments, the electronic apparatus 1 may provide the first image and the second image that may be independent of each other.

The second display area DA2 may include a transmission area TA between the second pixels P2. The transmission area TA may be an area in which light transmits and where no pixel may be disposed.

The non-display area NDA may be an area that does not provide an image and is adjacent to the display area DA. For example, the non-display area NDA may surround (e.g., entirely surround) the display area DA. The non-display area NDA may be where drivers for providing electrical signals or power to the first pixels P1 and the second pixels P2 may be disposed. The non-display area NDA may be where a pad, to which electronic components or printed circuit boards may be electrically connected, may be disposed.

The second display area DA2 may be circular or oval in plan view, as illustrated in FIG. 1A. As another example, the second display area DA2 may be polygonal such as a rectangular or bar type, as illustrated in FIG. 1B.

The second display area DA2 may be disposed inside the first display area DA1 (FIG. 1A) or at one side of the first display area DA1 (FIG. 1B). As illustrated in FIG. 1A, the second display area DA2 may be entirely surrounded by the first display area DA1. In some embodiments, the second display area DA2 may be partially surrounded by the first display area DA1. For example, the second display area DA2 may be located at one corner portion of the first display area DA1 and be partially surrounded by the first display area DA1.

A ratio of the second display area DA2 to the display area DA may be less than a ratio of the first display area DA1 to the display area DA. The electronic apparatus 1, as illustrated in FIG. 1A, may include one second display area or two or more second display areas as the second display area DA2.

The electronic apparatus 1 may include a mobile phone, a tablet PC, a laptop, or a smart watch or smart band worn around the wrist.

Figure 2A:
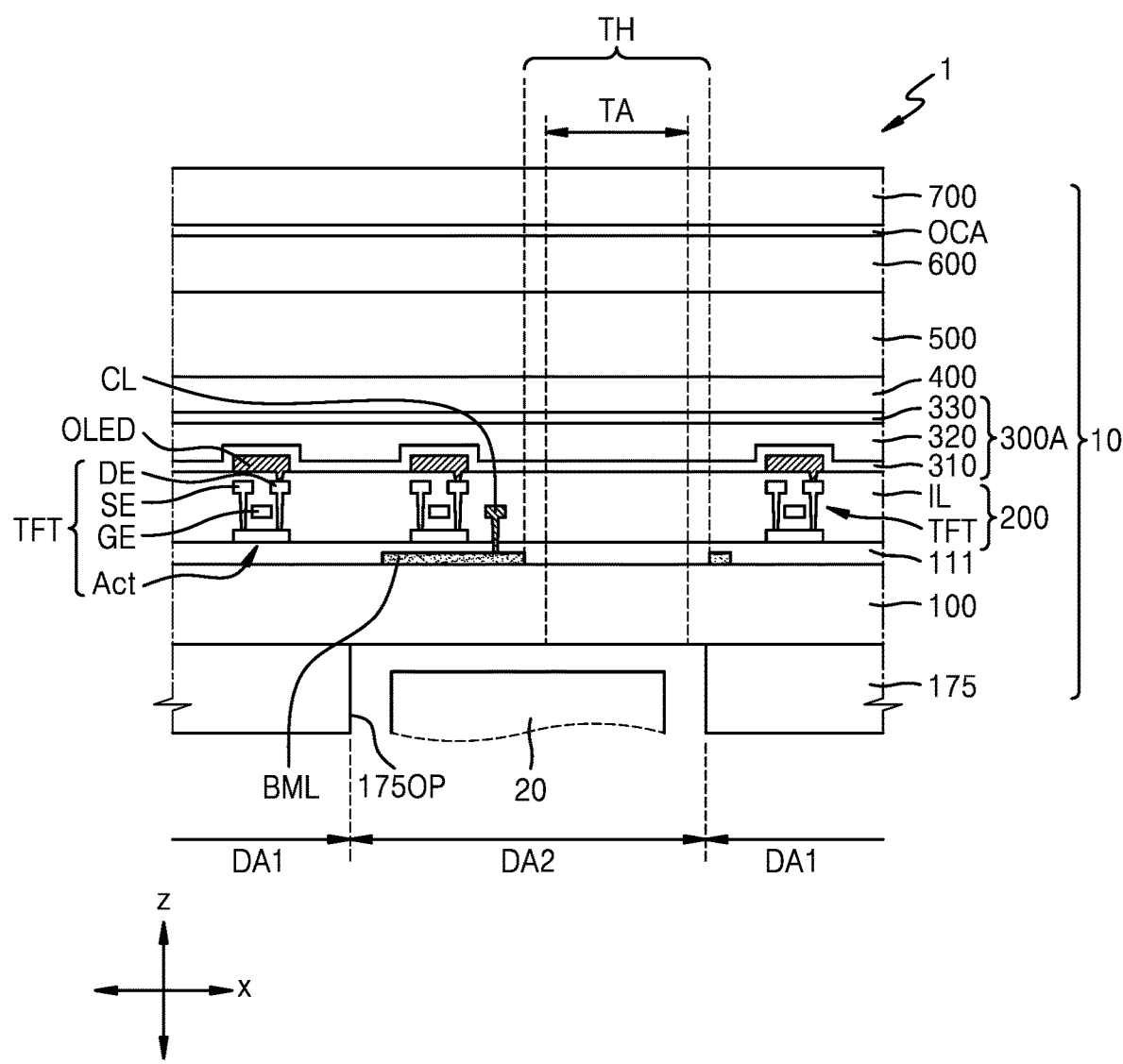
FIGS. 2A to 2C are schematic cross-sectional views of a part of an electronic apparatus according to an embodiment of the disclosure.
Figure 2B:
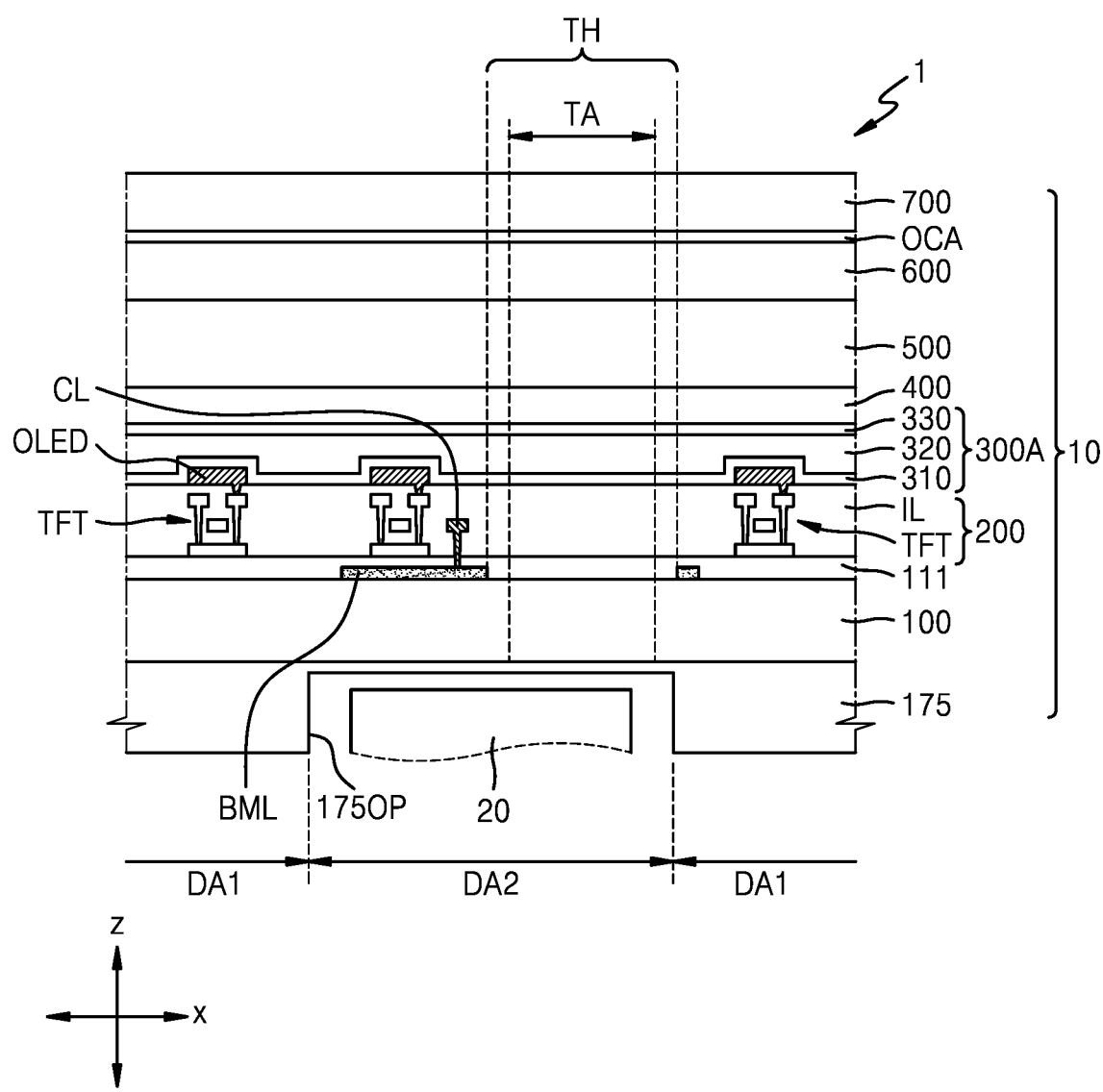
Figure 2C:
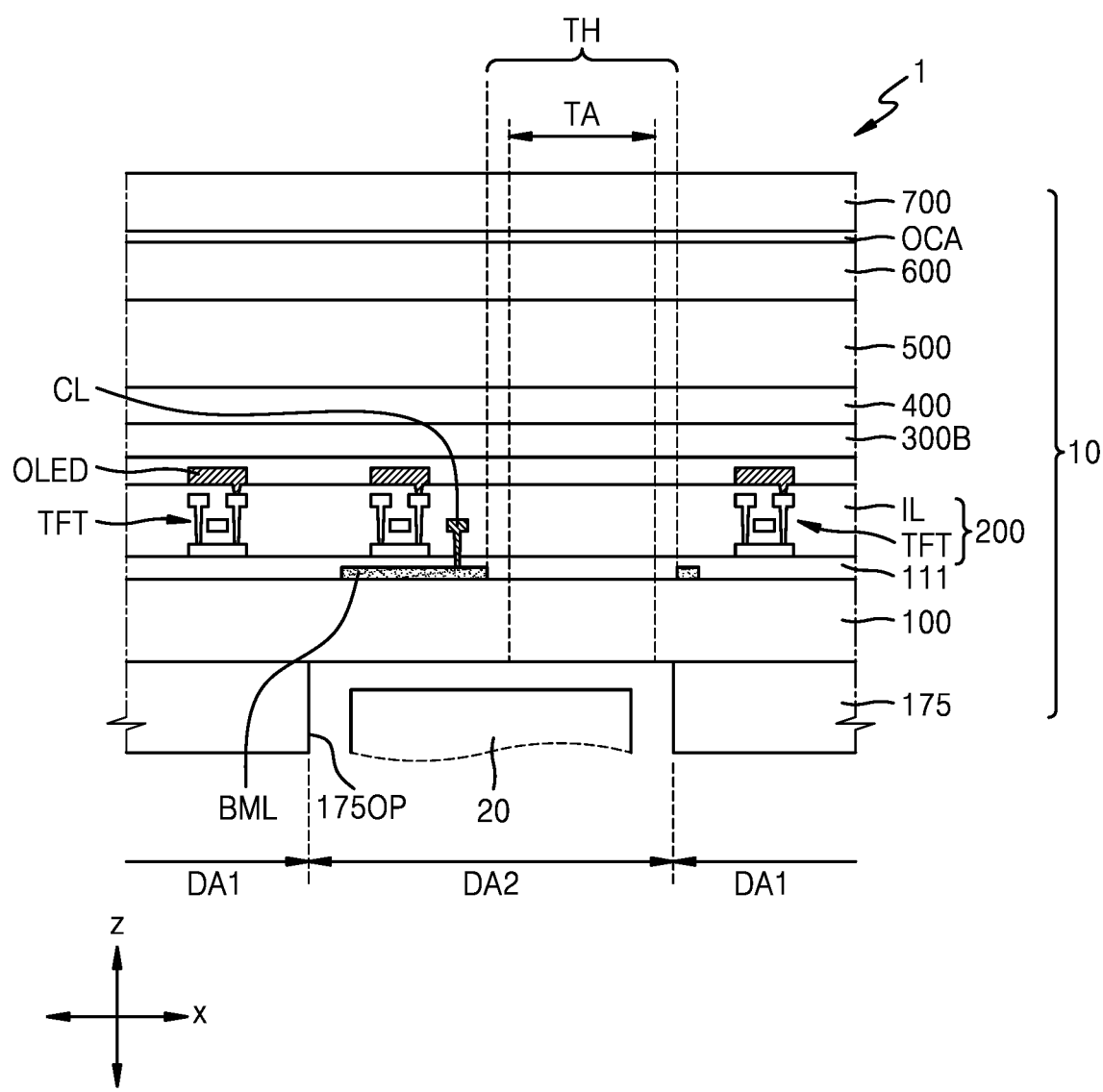
Figure 2D:
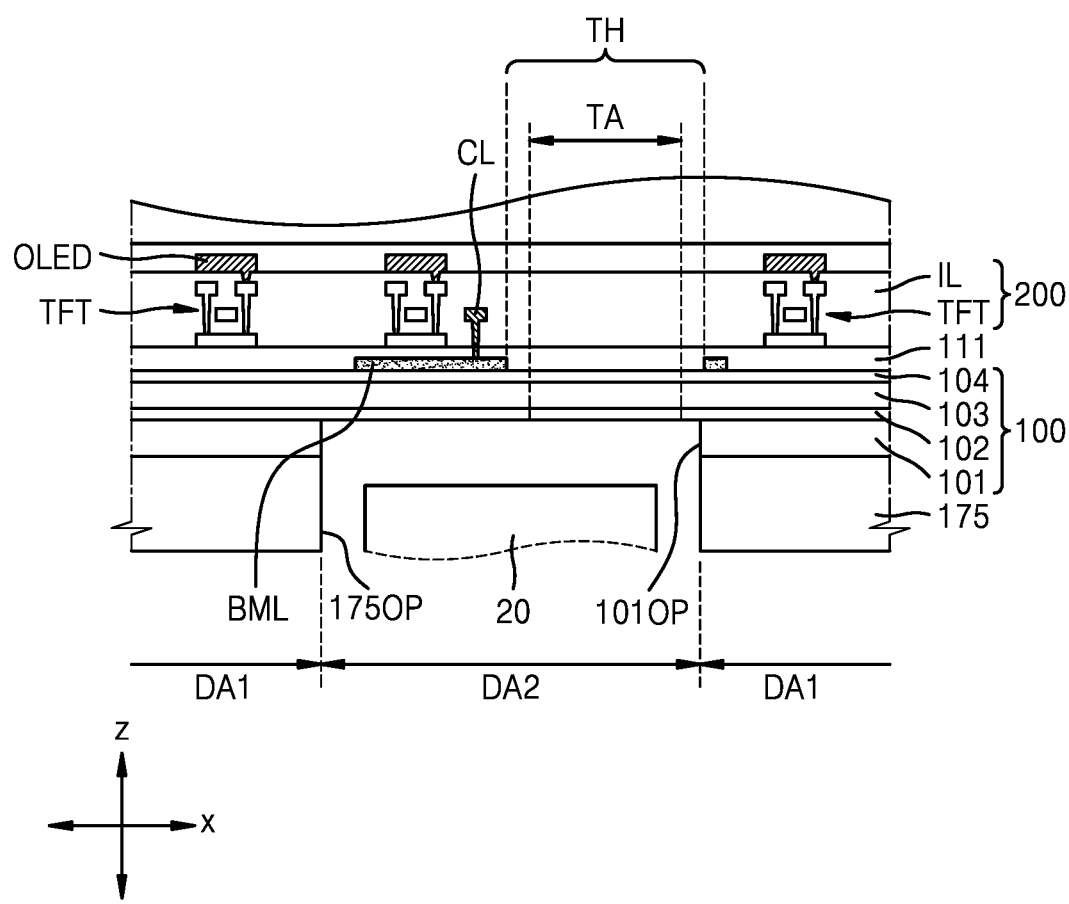
FIG. 2D is a schematic cross-sectional view of a part of an electronic apparatus according to an embodiment of the disclosure.

FIGS. 2A to 2C are schematic cross-sectional views of a part of the electronic apparatus 1 according to an embodiment of the disclosure. FIG. 2D is a schematic cross-sectional view of a part of the electronic apparatus 1 according to an embodiment of the disclosure.

Referring to FIGS. 2A to 2C, the electronic apparatus 1 may include the display device 10 and a component 20 disposed to overlap the display device 10.

The display device 10 may include a substrate 100, a display layer 200 disposed on the substrate 100, a thin film encapsulation layer 300A on the display layer 200, an input sensing layer 400, an optical functional layer 500, an anti-reflection layer 600, and a window 700.

The component 20 may be located in the second display area DA2. The component 20 may be an electronic component that uses light or sound. For example, the electronic component may include a sensor that measures a distance, such as a proximity sensor, a sensor that recognizes a part of the user's body, such as a fingerprint, an iris, a face, etc., a small lamp that outputs light, or an image sensor that captures an image, such as a camera. An electronic component that uses light may use light in various wavelength bands, such as visible light, infrared light, and ultraviolet light. An electronic component that uses sound may use ultrasound or sound in other frequency bands. In some embodiments, the component 20 may include sub-components such as a light emitting part and a light receiving part. The light emitting part and the light receiving part may have an integrated structure or a physically separated structure in which a pair of the light emitting part and the light receiving part constitute one component as the component 20.

The substrate 100 may include glass, polymer resin, or a combination thereof. For example, the polymer resin of the substrate 100 may include polyether sulfone, polyacrylate, polyether imide, polyethylene naphthalate, polyethylene terephthalate, polyphenylene sulfide, polyarylate, polyimide, polycarbonate, and/or cellulose acetate propionate. The substrate 100 including polymer resin may be flexible, rollable, or bendable. The substrate 100 may have a multi-layer structure including a layer including the above-described polymer resin and an inorganic layer (not shown).

The display layer 200 may be disposed on the front surface of the substrate 100, and a lower protection film 175 may be disposed on the rear surface of the substrate 100. The lower protection film 175 may be attached on the rear surface of the substrate 100. An adhesive layer may be provided between the lower protection film 175 and the substrate 100. As another example, the lower protection film 175 may be formed (e.g., directly formed) on the rear surface of the substrate 100. No adhesive layer may be provided between the lower protection film 175 and the substrate 100.

The lower protection film 175 may support and protect the substrate 100. The lower protection film 175 may include a first opening 1750P corresponding to the second display area DA2. The first opening 1750P of the lower protection film 175 may be a concave portion formed as a part of the lower protection film 175 having been removed in a thickness direction (e.g. a z direction). In some embodiments, the first opening 1750P of the lower protection film 175 may be formed as a part of the lower protection film 175 having been entirely removed in the thickness direction. The first opening 1750P may have a section of a through-hole as illustrated in FIGS. 2A and 2C. In some embodiments, the first opening 1750P of the lower protection film 175 may have a section of a blind-hole as illustrated in FIG. 2B as a part of the lower protection film 175 having been partially removed in the thickness direction.

As the lower protection film 175 may include the first opening 1750P, the transmittance of the second display area DA2, for example, the light transmittance of the transmission area TA, may be improved. The lower protection film 175 may include an organic insulating material such as polyethylene terephthalate (PET) and/or polyimide (PI).

The display layer 200 may include pixels. Each pixel may include a display element and may emit red, green, or blue light. The display element may include an organic light-emitting diode OLED. In some embodiments, an area in the organic light-emitting diode OLED, where light may be emitted, may correspond to a pixel.

The display layer 200 may include a display element layer including the organic light-emitting diode OLED that may be a display element, a circuit layer including a thin film transistor TFT electrically connected to the organic light-emitting diode OLED, a buffer layer 111 between the display element layer and the circuit layer, and an insulating layer IL. The thin film transistor TFT and the organic light-emitting diode OLED electrically connected to the thin film transistor TFT may be disposed in each of the first display area DA1 and the second display area DA2. The thin film transistor TFT may include a semiconductor layer Act, a gate electrode GE, a source electrode SE, and a drain electrode DE.

The second display area DA2 may include at least one transmission area TA where the thin film transistor TFT and the organic light-emitting diode OLED may not be disposed. The transmission area TA may be an area in which light that may be emitted from and/or proceeds toward the component 20 transmits. In the display device 10, the transmittance of the transmission area TA may be about 30% or more, about 40% or more, about 50% or more, about 60% or more, about 70% or more, about 75% or more, about 80% or more, about 85% or more, or about 90% or more.

A back metal layer (blocking metal layer, metal layer) BML may be disposed between the substrate 100 and the display layer 200, for example, between the substrate 100 and the thin film transistor TFT or between the substrate 100 and the buffer layer 111. The back metal layer BML may include at least one through-hole TH through which the light emitted from or proceeding toward the component 20 may pass. The through-hole TH of the back metal layer BML may be located in the transmission area TA. A metal portion of the back metal layer BML, where the through-hole TH may not be formed, may prevent the diffraction of light by a narrow gap between wirings connected to the pixel circuit PC or a narrow gap between parts of the pixel circuit PC in the second display area DA2.

The back metal layer BML may be connected to a connection line CL. The connection line CL may be a part of the gate electrode GE, the source electrode SE, or the drain electrode DE of the thin film transistor TFT, or a line electrically connected to the gate electrode GE, the source electrode SE, or the drain electrode DE. The back metal layer BML may have the same voltage level as that of the gate electrode GE, the source electrode SE, or the drain electrode DE through the connection line CL. In an embodiment, in case the thin film transistor TFT may be a driving thin film transistor that is described later with reference to FIG. 4, the back metal layer BML may have the same voltage level as that of a gate electrode, a source electrode, or a drain electrode of the driving thin film transistor, and the source electrode or the drain electrode of the driving thin film transistor may be a part of a driving voltage line. In case the back metal layer BML has a certain voltage level, deterioration of the performance of the thin film transistor TFT may be prevented or the performance of the thin film transistor TFT may be improved.

The display layer 200 may be sealed with an encapsulation member. In some embodiments, the encapsulation member may include the thin film encapsulation layer 300A as illustrated in FIGS. 2A and 2B. The thin film encapsulation layer 300A may include at least one inorganic encapsulation layer and at least one organic encapsulation layer. In an embodiment, the thin film encapsulation layer 300A may include first and second inorganic encapsulation layers 310 and 330 and an organic encapsulation layer 320 therebetween.

In some embodiments, the encapsulation member may include an encapsulation substrate 300B as illustrated in FIG. 2C. The encapsulation substrate 300B may be disposed to face the substrate 100 with the display layer 200 therebetween. There may be a gap between the encapsulation substrate 300B and the display layer 200. The encapsulation substrate 300B may include glass. A sealant may be disposed between the substrate 100 and the encapsulation substrate 300B, and the sealant may be disposed in the non-display area NDA that is previously described with reference to FIG. 1A or 1B. The sealant disposed in the non-display area NDA may surround the display area DA to prevent intrusion of moisture through a side surface.

An input sensing layer 400 may obtain coordinate information according to an external input, for example, a touch event of an object such as a finger or a stylus pen. The input sensing layer 400 may include a touch electrode and trace lines connected to the touch electrode. The input sensing layer 400 may sense an external input in a mutual-capacitance (mutual cap) method or a self-capacitance (self cap) method.

The input sensing layer 400 may be formed on the encapsulation member. As another example, the input sensing layer 400 that may be formed separately may be bonded to the encapsulation member via an adhesive layer such as an optical transparent adhesive OCA. In an embodiment, as illustrated in FIGS. 2A to 2C, the input sensing layer 400 may be formed (e.g., directly formed) on the thin film encapsulation layer 300A or the encapsulation substrate 300B. The adhesive layer may not be provided between the input sensing layer 400 and the thin film encapsulation layer 300A or the encapsulation substrate 300B.

An optical functional layer 500 may improve optical efficiency. For example, the front optical efficiency and/or side visibility of the light emitted from the organic light-emitting diode OLED may be improved, and the diffraction of the light passing through the transmission area TA and then proceeding toward the component 20 may be reduced or prevented.

An anti-reflection layer 600 may reduce reflectivity of light (external light) input toward the display device 10 from the outside.

In some embodiments, the anti-reflection layer 600 may include an optical plate having a retarder and/or a polarizer. A retarder may be of a film type or a liquid crystal coating type and may include a λ/2 retarder and/or a λ/4 retarder. A polarizer may also be a film type or a liquid crystal coating type. A film type polarizer may include a stretchable synthetic resin film, and the liquid crystal coating-type polarizer may include liquid crystals arranged in a certain array.

In some embodiments, the anti-reflection layer 600 may include a filter plate including a black matrix and color filters as illustrated in FIG. 2C. A filter plate may include color filters, a black matrix, and an overcoat layer disposed in each pixel.

In some embodiments, the anti-reflection layer 600 may include a destructive interference structure. A destructive interference structure may include a first reflective layer and a second reflective layer disposed on different layers. First reflection light and second reflection light respectively reflected from the first reflective layer and the second reflective layer may destructively interfere with each other, and thus, the reflectivity of the external light may be reduced.

A window 700 may be disposed on the anti-reflection layer 600 and coupled to the anti-reflection layer 600 through an adhesive layer such as an optical transparent adhesive OCA. Although FIGS. 2A to 2C illustrate that the window 700 is disposed on the anti-reflection layer 600, in some embodiments, the positions of the anti-reflection layer 600 and the optical functional layer 500 may be switched with each other. The window 700 may be coupled to the optical functional layer 500 through an adhesive layer such as an optical transparent adhesive OCA. In some embodiments, the optical transparent adhesive OCA may be omitted between the window 700 and a layer under the window 700, for example, an anti-reflection layer or an optical functional layer.

One component or multiple components as the component 20 may be disposed in the second display area DA2. In case the electronic apparatus 1 includes multiple components as the component 20, the electronic apparatus 1 may include multiple second display areas by as many as the number of components 20 as the second display area DA2. For example, the electronic apparatus 1 may include multiple second display areas apart from each other as the second display areas DA2. In some embodiments, the components 20 may be disposed in one second display area as the second display area DA2. For example, the electronic apparatus 1 may include the second display area DA2 that may be of a bar type as described with reference to FIG. 1B, the components 20 may be arranged spaced apart from each other in the length direction, for example, the x direction of FIG. 1B, of the second display area DA2.

Although FIGS. 2A to 2C illustrate that the display device 10 may include the organic light-emitting diode OLED as a display element, the display device 10 of the disclosure is not limited thereto. In another embodiment, the display device 10 may include a light-emitting display device including an inorganic material such as a micro LED, for example, an inorganic light emitting display or an inorganic display device, or a display device such as a quantum-dot light-emitting display device. For example, the light-emitting layer of the display element provided in the display device 10 may include an organic material, an inorganic material, quantum dots, an organic material and quantum dots, or an inorganic material and quantum dots.

Although FIGS. 2A to 2C illustrate that the display device 10 may include the substrate 100 having a constant thickness, in another embodiment, the thickness of the substrate 100 in the transmission area TA may be less than the thickness in other areas.

Referring to FIG. 2D, the substrate 100 may include layers, and at least one layer of the layers may include an opening located in the transmission area TA. For example, the substrate 100 may include a first base layer 101, a first barrier layer 102, a second base layer 103, and a second barrier layer 104, which may be sequentially stacked on each other.

The first base layer 101 and the second base layer 103 each may include polymer resin. The polymer resin may include polyethersulphone (PES), polyarylate (PAR), polyetherimide (PEI), polyethylene naphthalate (PEN), polyethylene terephthalate (PET), polyphenylene sulfide (PPS), polyimide (PI), polycarbonate, cellulose triacetate (TAC), cellulose acetate propionate (CAP), or a combination thereof. The polymer resin may be transparent.

The first barrier layer 102 and the second barrier layer 104 each may include, as a barrier layer for preventing intrusion of external foreign materials, a single layer or a multilayer including an inorganic insulating material such as a silicon nitride, a silicon oxynitride, and/or a silicon oxide.

As a part of the first base layer 101 corresponding to the transmission area TA may be removed, the first base layer 101 may include a second opening 101OP. Although FIG. 2D illustrates the second opening 101OP may have a section of a through-hole, in another embodiment, the second opening 101OP may have a section of a blind-hole.

Figure 3A:
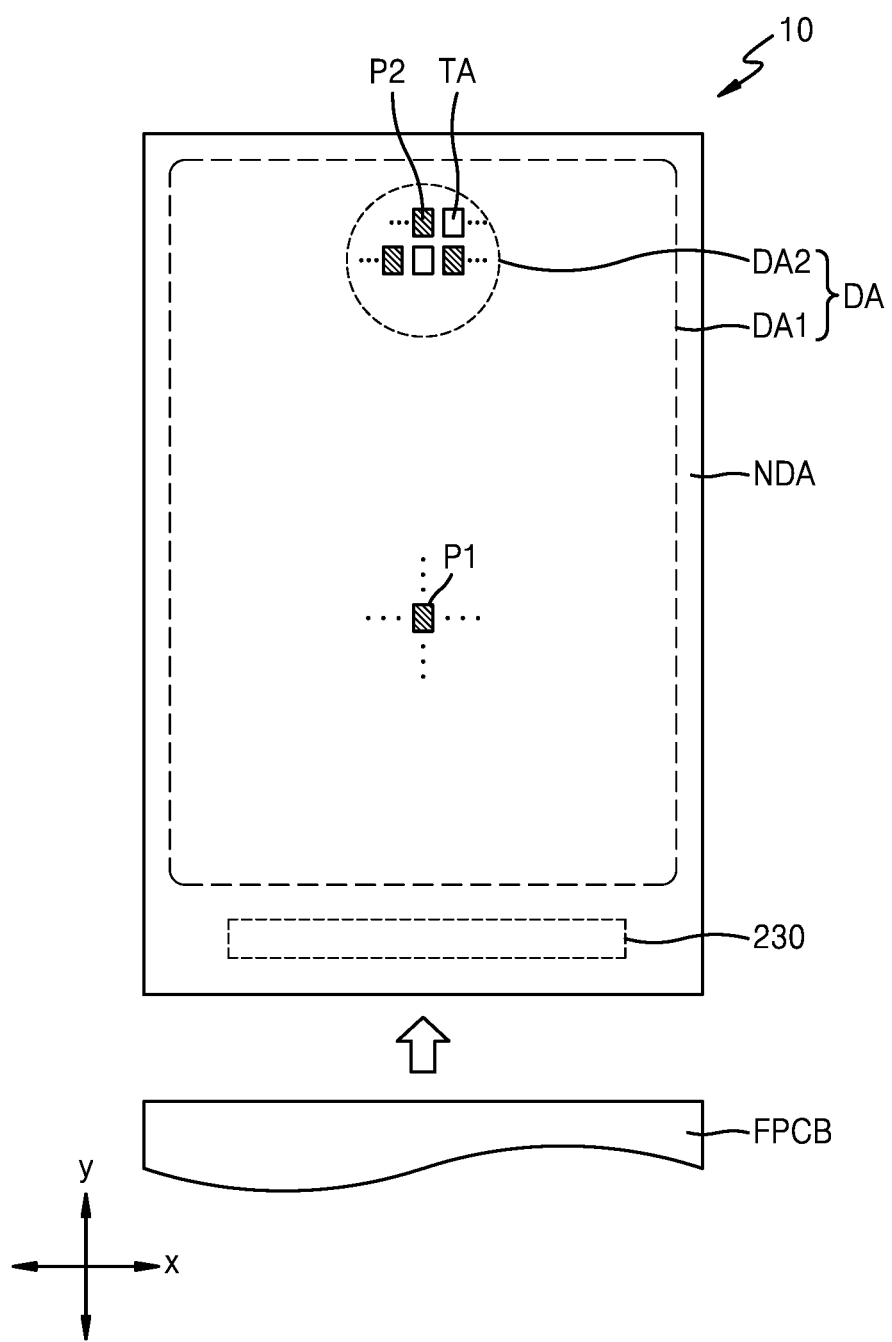
FIGS. 3A and 3B are schematic plan views of a display device according to an embodiment of the disclosure.
Figure 3B:
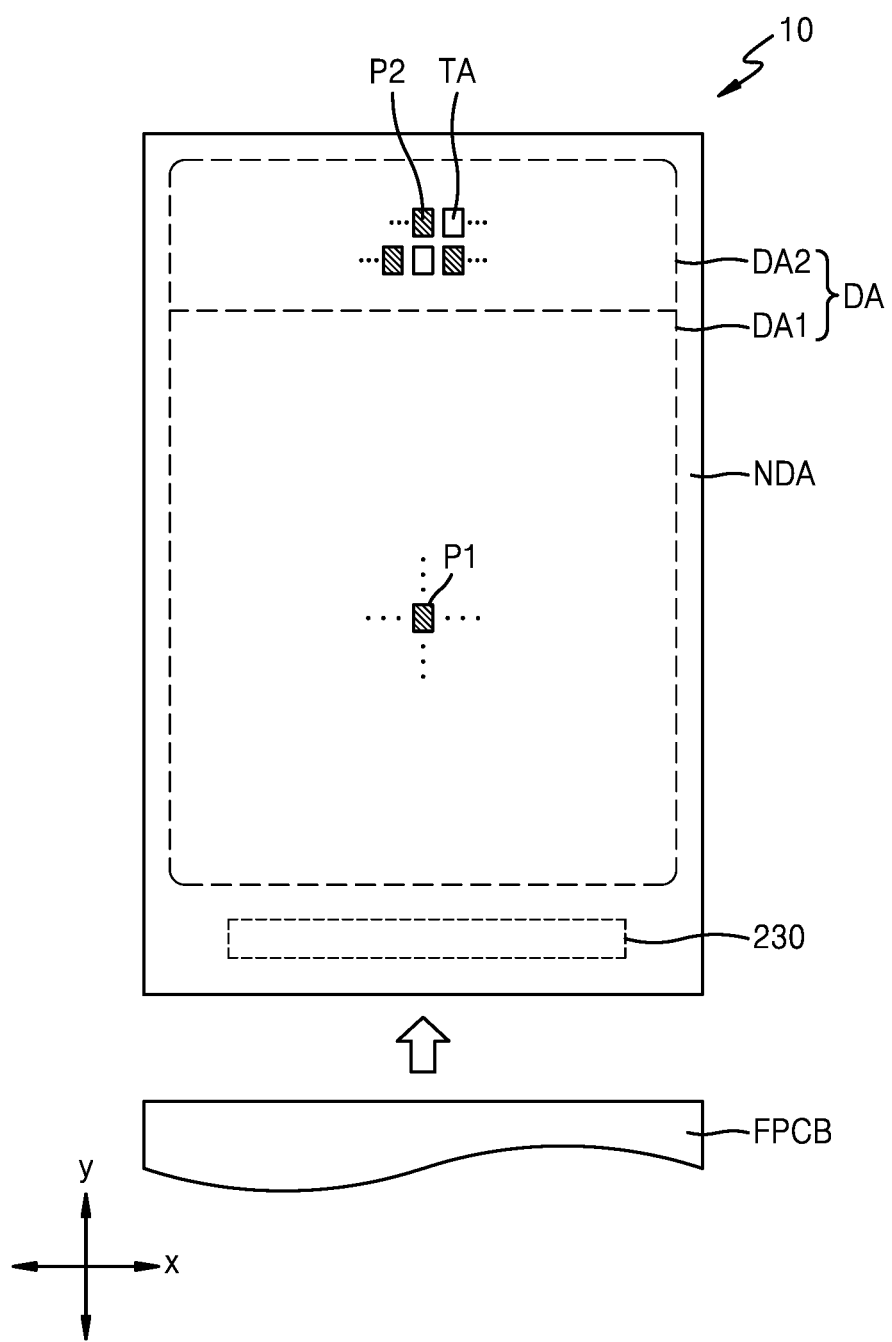

FIGS. 3A and 3B are schematic plan views of a display device according to an embodiment of the disclosure.

Referring to FIGS. 3A and 3B, the display device 10 may include an array of pixels disposed on the substrate 100. The pixels may include the first pixels P1 disposed in the first display area DA1 and the second pixels P2 disposed in the second display area DA2.

The display area DA may include the first display area DA1 and the second display area DA2, and the size of the first display area DA1 and the size of the second display area DA2 may be different from each other. The size of the first display area DA1 may be greater than the size of the second display area DA2.

The first pixels P1 may be two-dimensionally arranged in the first display area DA1, and the second pixels P2 may be two-dimensionally arranged in the second display area DA2. The transmission area TA may be disposed in the second display area DA2. The transmission area TA may be disposed between the second pixels P2 neighboring each other.

The non-display area NDA may entirely surround the display area DA. A scan driver or a data driver may be disposed in the non-display area NDA. A pad 230 may be located in the non-display area NDA. The pad 230 may be disposed adjacent to any one of edges of the substrate 100. The pad 230 may be exposed without being covered by the insulating layer, and may be electrically connected to a flexible printed circuit board FPCB. The flexible printed circuit board FPCB may electrically connect a controller to the pad 230, and may supply signals or power transmitted from the controller to the pixel circuits or wires. In some embodiments, a data driver may be disposed in the flexible printed circuit board FPCB. The pad 230 may be connected to wirings to transmit signals or voltages of the flexible printed circuit board FPCB to the first pixels P1 and the second pixels P2.

In another embodiment, instead of the flexible printed circuit board FPCB, an integrated circuit may be disposed on the pad 230. The integrated circuit may include, for example, a data driver, and may be electrically connected to the pad 230 via an anisotropic conductive film containing a conductive ball.

Each first pixel P1 and each second pixel P2 may emit light of a certain color by using the organic light-emitting diode OLED of FIGS. 2A to 2C. Each organic light-emitting diode OLED may emit, for example, red, green, or blue light. Each organic light-emitting diode OLED may be connected to a pixel circuit including a transistor and a capacitor.

Figure 4:
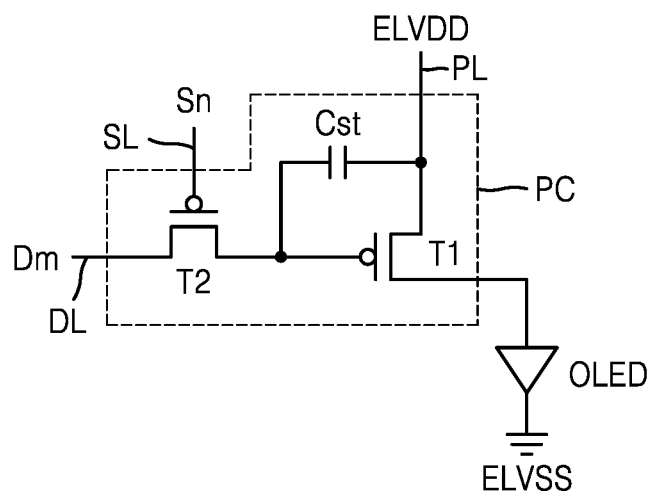
FIG. 4 is a schematic circuit diagram of a pixel circuit connected to an organic light-emitting diode of a display device according to an embodiment of the disclosure.

FIG. 4 is a schematic circuit diagram of a pixel circuit connected to an organic light-emitting diode of a display device according to an embodiment of the disclosure.

Referring to FIG. 4, the organic light-emitting diode OLED may be electrically connected to the pixel circuit PC. The pixel circuit PC may include a first thin film transistor T1, a second thin film transistor T2, and a storage capacitor Cst.

The second thin film transistor T2, as a switching thin film transistor, may be connected to a scan line SL and a data line DL, and may transmit a data voltage, or a data signal Dm, input through the data line DL to the first thin film transistor T1 on the basis of a switching voltage, or a switching signal Sn, input through the scan line SL. The storage capacitor Cst may be connected to the second thin film transistor T2 and a driving voltage line PL, and may store a voltage corresponding to a difference between the voltage received from the second thin film transistor T2 and a first power voltage ELVDD supplied to the driving voltage line PL.

The first thin film transistor T1, as a driving thin film transistor, may be connected to the driving voltage line PL and the storage capacitor Cst, and may control a driving current flowing in the organic light-emitting diode OLED from the driving voltage line PL corresponding to a value of the voltage stored in the storage capacitor Cst. The organic light-emitting diode OLED may emit light having a certain luminance according to the driving current. A counter electrode, for example, a cathode, of the organic light-emitting diode OLED may receive a second power voltage ELVSS.

Although FIG. 4 illustrates that the pixel circuit PC may include two thin film transistors and one storage capacitor, the disclosure is not limited thereto. The number of thin film transistors and the number of storage capacitors may be variously changed according to the design of the pixel circuit PC. For example, the pixel circuit PC may include three or more thin film transistors.

Figure 5:
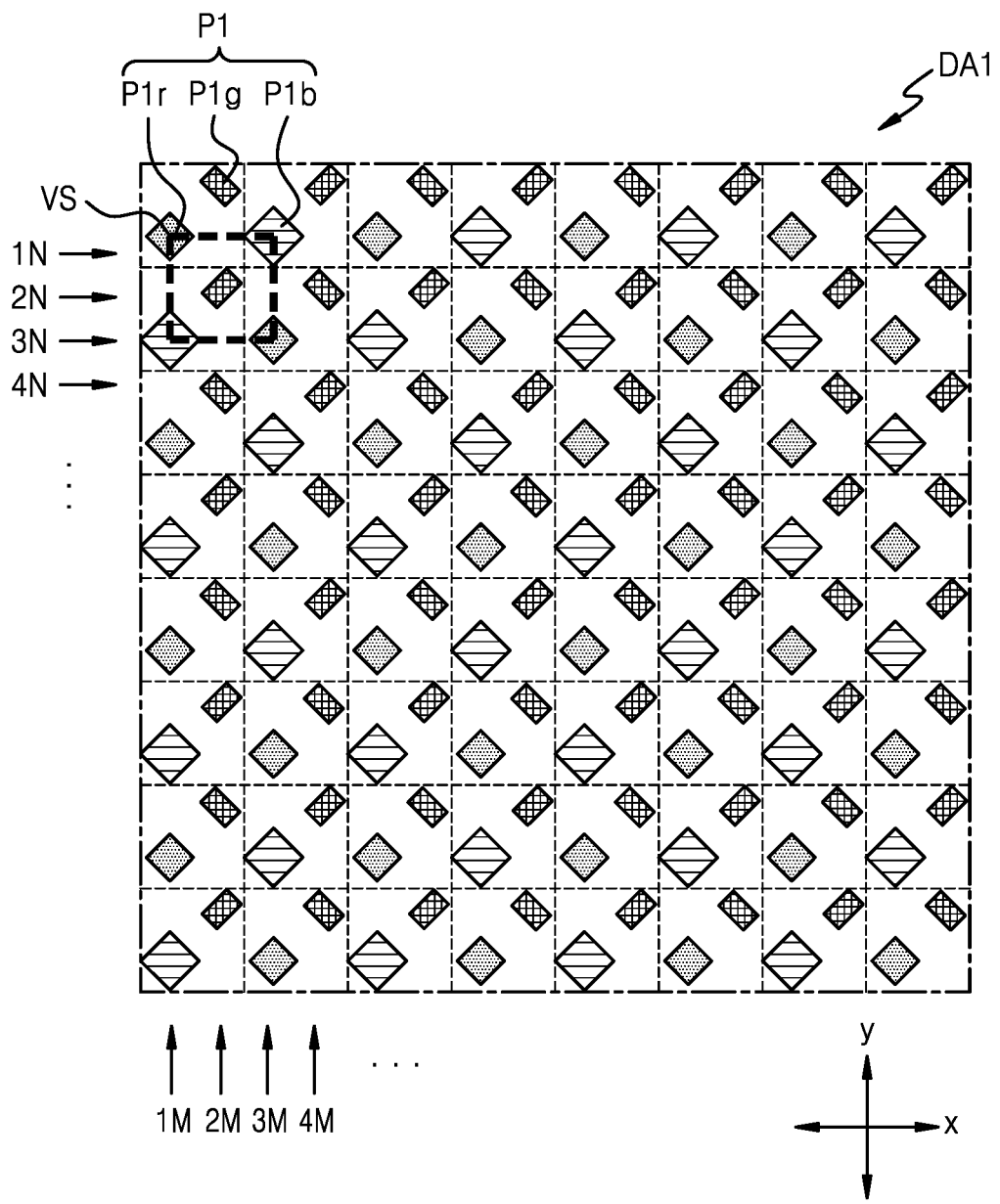
FIG. 5 is a schematic plan view of a part of a first display area of a display device according to an embodiment of the disclosure.

FIG. 5 is a schematic plan view of a part of a first display area of a display device according to an embodiment of the disclosure.

Referring to FIG. 5, the first pixels P1 may be disposed in the first display area DA1. The first pixels P1 may include a first red pixel P1r, a first green pixel P1g, and a first blue pixel P1b. In some embodiments, as illustrated in FIG. 5, the first red pixel P1r, the first green pixel P1g, and the first blue pixel P1b may be disposed in a PenTile® type. For example, the first red pixels P1r and the first blue pixels P1b may be alternately arranged in a first row 1N. The first green pixels P1g may be arranged in a second row 2N and be apart from each other at certain intervals. The first blue pixels P1b and the first red pixels P1r may be alternately arranged in an adjacent third row 3N. The first green pixels P1g may be arranged in a fourth row 4N and be apart from each other at certain intervals. The first red and blue pixels P1r and P1b in the first row 1N and the first green pixels P1g in the second row 2N may be shifted each other. The first blue and red pixels P1b and P1r in the third row 3N and the first green pixels P1g in the fourth row 4N may be shifted each other. Therefore, the first red pixels P1r and the first blue pixels P1b may be alternately arranged in a first column 1M. The first green pixels P1g may be arranged in a second column 2M and be apart from each other at certain intervals. The first blue pixels P1b and the first red pixels P1r may be alternately arranged in a third column 3M. The first green pixels P1g may be arranged in a fourth column 4M and be apart from each other at certain intervals. Such pixel arrangement may be repeated up to an $M^{th}$ column. The pixel arrangement structure described above may be expressed differently as follows: the first red pixels P1r are arranged at first and third vertices facing each other from among the vertices of a virtual rectangle VS having a center point of the first green pixel P1g as a center point of a rectangle, and the first blue pixels P1b are arranged at second and fourth vertices that are the other vertices. In this case, the virtual rectangle VS may be modified in various forms, such as a rectangle, a rhombus, and a square Such a pixel arrangement structure may be referred to as a PenTile® matrix structure or a PenTile® structure, and high resolution may be implemented with a small number of pixels by applying a rendering driving that expresses colors by sharing adjacent pixels. In another embodiment, the first red pixel P1r, the first green pixel P1g, and the first blue pixel P1b may be disposed in a stripe type.

A first red pixel P1r, a first green pixel P1g, and a first blue pixel P1b may have sizes or widths different from one another. For example, the first blue pixel P1b may be larger than the first red pixel P1r and the first green pixel P1g, and the first red pixel P1r may be larger than the first green pixel P1g. In some embodiments, the first green pixel P1g may be rectangular, and the first green pixels P1g that neighbor each other may extend in different directions.

Figure 6:
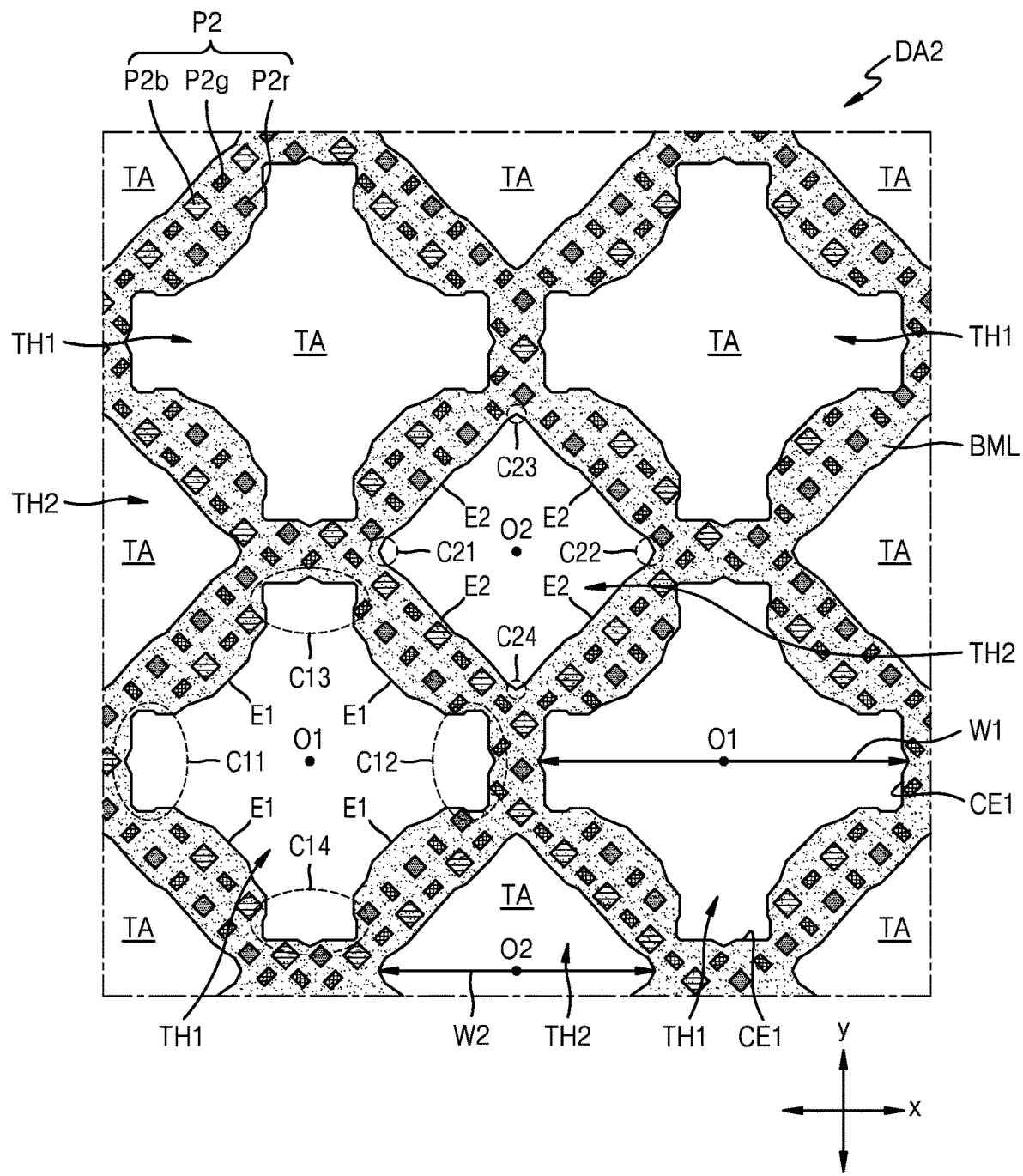
FIG. 6 is a schematic plan view of a second display area of a display device according to an embodiment of the disclosure.

FIG. 6 is a schematic plan view of a second display area of a display device according to an embodiment of the disclosure.

Referring to FIG. 6, the second pixels P2 may be disposed in the second display area DA2. The second pixels P2 may include a second red pixel P2r, a second green pixel P2g, and a second blue pixel P2b. In some embodiments, the second red pixel P2r, the second green pixel P2g, and the second blue pixel P2b may be disposed in a pentile type. In another embodiment, the second red pixel P2r, the second green pixel P2g, and the second blue pixel P2b may be disposed in a stripe type.

The transmission area TA may be disposed adjacent to the second pixels P2. For example, the transmission area TA may be disposed between the second pixels P2. The transmission areas TA, as illustrated in FIG. 6, may be arranged in the x direction, the y direction and/or a direction oblique to the x and y directions adjacent to each other as illustrated.

The back metal layer BML may be disposed in the second display area DA2. The back metal layer BML may include through-holes corresponding to the transmission area TA, and in this regard, FIG. 6 illustrates a first through-hole TH1 and a second through-hole TH2. A metal part may be between the first through-hole TH1 and the second through-hole TH2, and the second red pixel P2r, the second green pixel P2g, and the second blue pixel P2b may be disposed on the metal part.

The first through-hole TH1 and the second through-hole TH2 may be apart from each other, but may be disposed adjacent to each other. The first through-hole TH1 and the second through-hole TH2 may be different from each other in terms of shape, pattern, size, and/or width (also referred to herein as shapes and/or sizes). Shapes being different from each other may mean that the condition of similarity in geometry, for example, the Euclidean geometry, may not be satisfied. For example, in case one of the first through-hole TH1 and the second through-hole TH2 may be magnified or reduced and then overlapped with the other, if the first through-hole TH1 and the second through-hole TH2 do not match 100%, it may be stated that the shape of the first through-hole TH1 and the shape of the second through-hole TH2 may be different.

The first through-hole TH1 may include corner parts disposed in a first direction, for example, the y direction, and a second direction, for example, the x direction, crossing the first direction from a first center O1 of the first through-hole TH1. For example, the first through-hole TH1 may include four corner parts (hereinafter, referred to as the first to fourth corner parts C11, C12, C13, and C14) disposed in the left, right, up, and down directions from the first center O1.

A side edge E1 between two neighboring corner parts of the first through-hole TH1 may be largely curved. Each side edge E1 between the first corner part C11 and the second corner part C12, between the second corner part C12 and the third corner part C13, between the third corner part C13 and the fourth corner part C14, and between the fourth corner part C14 and the first corner part C11 may be largely curved. The side edge E1 being largely curved may be distinguished from a structure that extends in the x direction and suddenly bents in the y direction, for example, a structure that may be bent about 90°.

The edges of the first through-hole TH1 may include an uneven part. For example, the edges of the first through-hole TH1 may include an uneven part with irregular unevenness. For example, each side edge E1 between the first corner part C11 and the third corner part C13, between the second corner part C12 and the third corner part C13, between the second corner part C12 and the fourth corner part C14, and between the fourth corner part C14 and the first corner part C11 may include irregular unevenness. In some embodiments, the side edge E1 of the first through-hole TH1 may be largely curved (or macroscopically) and may include irregular unevenness locally (or microscopically).

The second through-hole TH2 may include corner parts disposed in the first direction, for example, the y direction, and the second direction, for example, the x direction, crossing the first direction, from a second center O2 of the second through-hole TH2. For example, the second through-hole TH2 may include four corner parts (hereinafter, referred to as the fifth to eighth corner parts C21, C22, C23, and C24) disposed in the left, right, up, and down directions from the second center O2.

The edges of the second through-hole TH2 may include an uneven part. For example, the edges of the second through-hole TH2 may include irregular unevenness. For example, each side edge E2 between the fifth corner part C21 and the seventh corner part C23, between the sixth corner part C22 and the seventh corner part C23, between the sixth corner part C22 and the eighth corner part C24, and between the eighth corner part C24 and the fifth corner part C21 may include irregular unevenness. In some embodiments, the side edge E2 of the second through-hole TH2 may be largely curved (or macroscopically) and may include irregular unevenness locally (or microscopically).

A first width W1 of the first through-hole TH1 may be different from a second width W2 of the second through-hole TH2. For example, the first width (maximum width) W1 of the first through-hole TH1 passing the first center O1 may be greater than the second width (maximum width) W2 of the second through-hole TH2 passing the second center O2. The first width W1 may be about 200 μm to about 300 μm or about 250 μm to about 300 μm. In an embodiment, the first width W1 may be about 270 μm.

Multiple first through-holes as the first through-hole TH1 may be arranged to surround the second through-hole TH2. In this respect, FIG. 6 illustrates that four first through-holes TH1 may be disposed around one second through-hole TH2. In some embodiments, the first through-holes TH1 may be arranged around the second through-hole TH2 such that each of the side edge E1 of the first through-hole TH1 and the side edge E2 of the second through-hole TH2 may be adjacent to each other. The corner parts of the first through-hole TH1 and the corner parts of the second through-hole TH2 may be disposed adjacent to each other. For example, the two neighboring corner parts of the second through-holes TH2, and the two neighboring corner parts of the first through-holes TH1 may be disposed adjacent to each other.

According to the embodiment described with reference to FIG. 6, the first through-hole TH1 may be approximately a cross type and the second through-hole TH2 may be approximately a rhombus type, and the first through-hole TH1 and/or the second through-hole TH2 may be variously changed as described below with reference to FIGS. 7 to 19.

Figure 7:
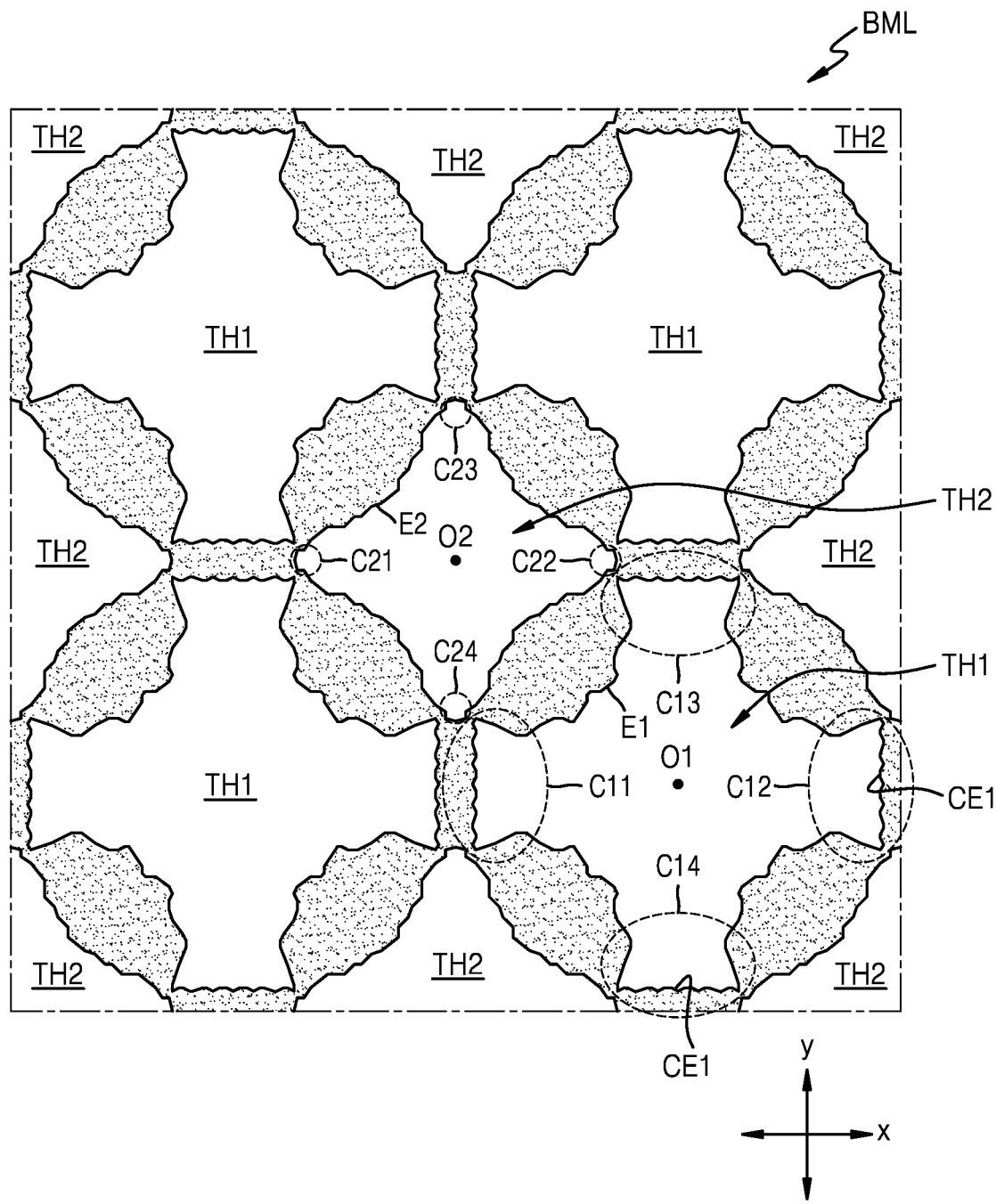
FIG. 7 is a schematic plan view of an excerpt of a metal layer of a display device according to an embodiment of the disclosure.

FIG. 7 is a schematic plan view of an excerpt of a metal layer of a display device according to an embodiment of the disclosure.

Referring to FIG. 7, the back metal layer BML may include the first through-hole TH1 and the second through-hole TH2, which may be different in terms of shape and/or size. A metal part BML-M of the back metal layer BML may overlap the second pixels as described above with reference to FIG. 6.

The first through-hole TH1 may include corner parts, for example, the first to fourth corner parts C11, C12, C13, and C14, which may be disposed in different directions with respect to the first center O1. The side edge E1 between two neighboring corner parts of the first through-hole TH1 may be largely curved and may have locally irregular unevenness. According to the embodiment illustrated in FIG. 7, a corner edge CE1 of each of the first to fourth corner parts C11, C12, C13, and C14 of the first through-hole TH1 may include irregular unevenness.

The second through-hole TH2 may include corner parts, for example, fifth to eighth corner parts C21, C22, C23, and C24, disposed in different directions with respect to the second center O2. Unlike the second through-hole TH2 described with reference to FIG. 6, the side edge E2 of the second through-hole TH2 of FIG. 7 may be largely curved. The second through-hole TH2 may be largely or macroscopically curved and may include irregular unevenness locally or microscopically. Although the second through-hole TH2 may be approximately a cross type, the shape of the second through-hole TH2 may be different from that of the first through-hole TH1. For example, while the second through-hole TH2 has a cross shape in which the width of each of the fifth to eighth corner parts C21, C22, C23, and C24 thereof decreases in a direction away from the second center O2, the first through-hole TH1 has a cross shape, which may be different in a detailed shape, in which the width of each of the first to fourth corner parts C11, C12, C13, and C14 may be a certain width, for example, about 70 μm to about 90 μm.

The first width of the first through-hole TH1 may be greater than the second width of the second through-hole TH2. Multiple first through-holes as the first through-hole TH1 may be arranged around the second through-hole TH2 as a center. For example, the side edge E1 of the first through-hole TH1 and the side edge E2 of the second through-hole TH2 may be disposed adjacent to each other, and/or the corner parts of the first through-hole TH1 and the corner parts of the second through-hole TH2 may be disposed adjacent to each other, as described with reference to FIG. 6.

Figure 8:
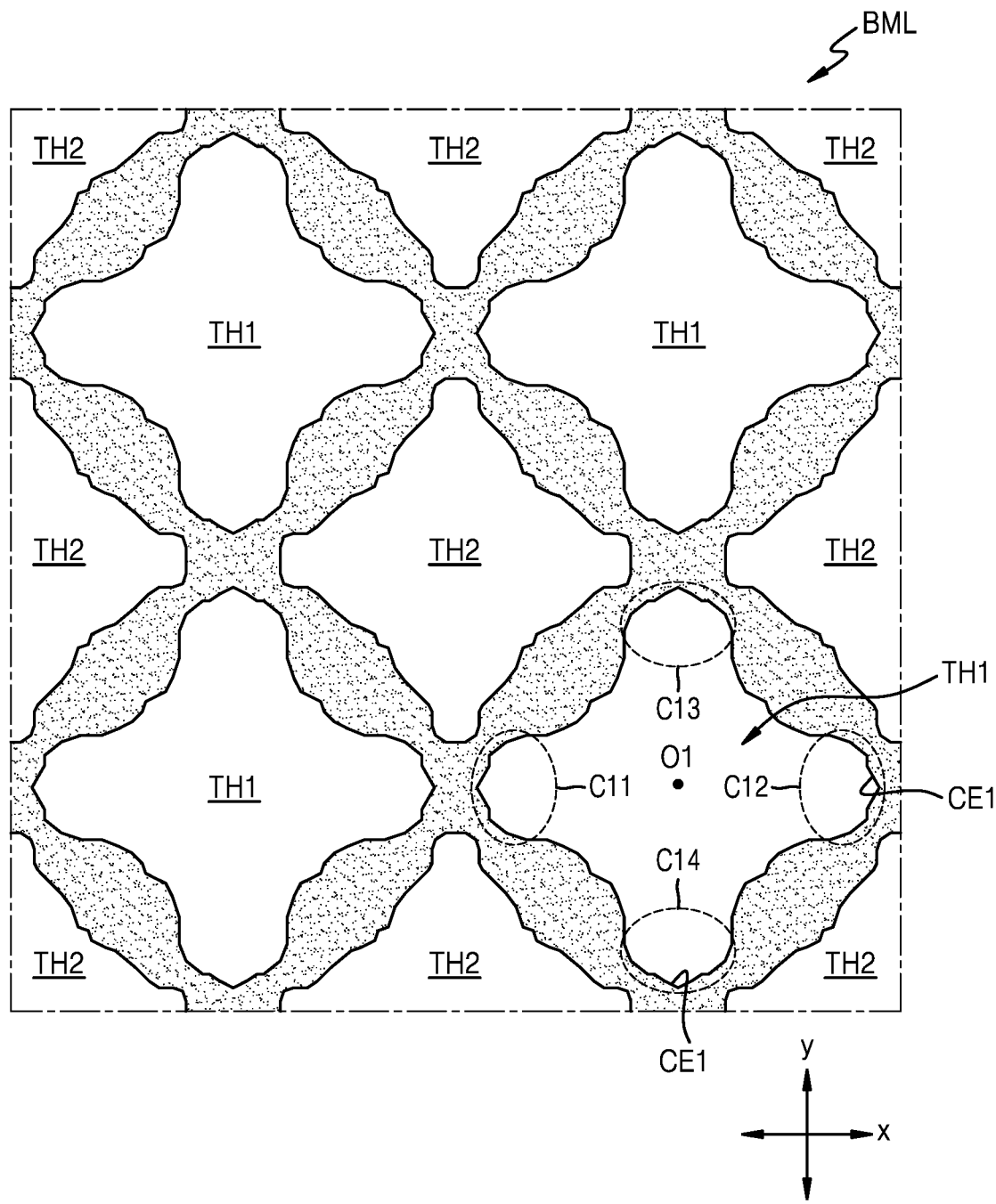
FIG. 8 is a schematic plan view of an excerpt of a metal layer of a display device according to an embodiment of the disclosure.
Figure 9:
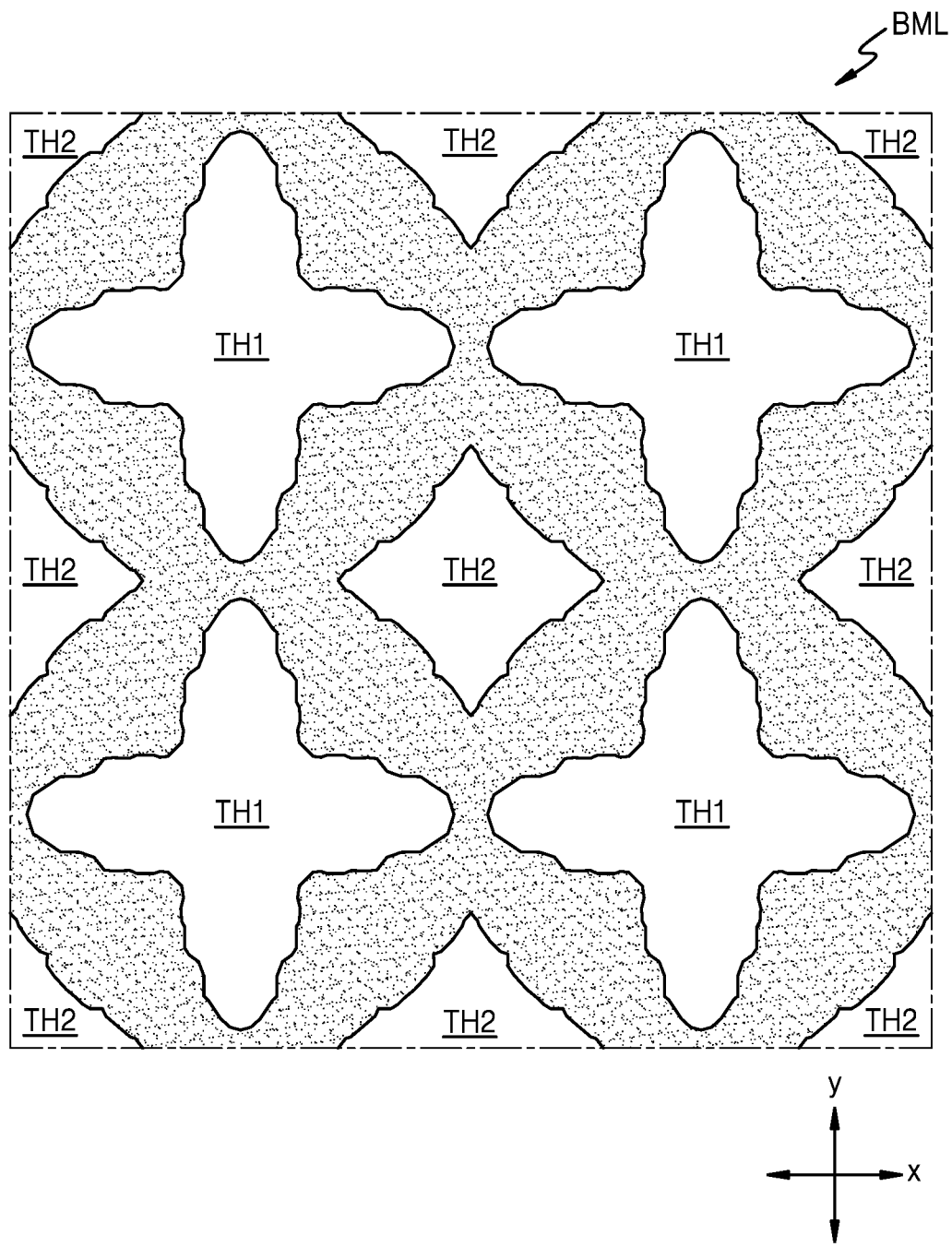
FIG. 9 is a schematic plan view of an excerpt of a metal layer of a display device according to an embodiment of the disclosure.
Figure 10:
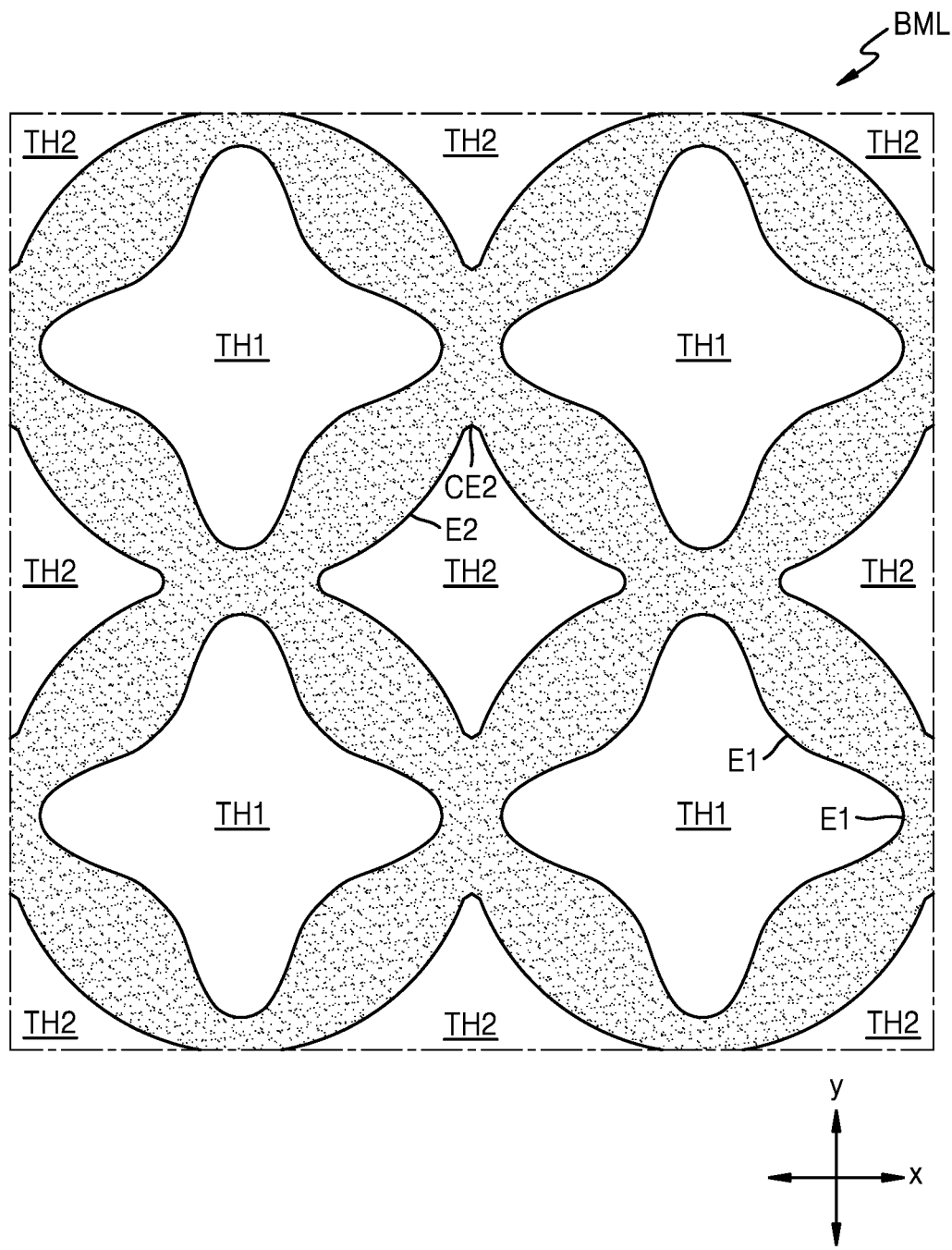
FIG. 10 is a schematic plan view of an excerpt of a metal layer of a display device according to an embodiment of the disclosure.

FIGS. 8 to 10 are schematic plan views of excerpts of a metal layer of a display device according to embodiments of the disclosure.

Referring to FIGS. 8 and 9, the back metal layer BML may include the first through-hole TH1 and the second through-hole TH2 having different shapes and/or sizes. The features regarding the metal part BML-M of the back metal layer BML and the structure and arrangement of the first through-hole TH1 and the second through-hole TH2 may be the same as those described with reference to FIGS. 6 and 7.

Unlike the corner edge CE1 of each of the first to fourth corner parts C11, C12, C13, and C14 of the first through-hole TH1 described with reference to FIGS. 6 and 7 extending largely in the x direction or the y direction, the corner edge CE1 of each of the first to fourth corner parts C11, C12, C13, and C14 of the first through-hole TH1 of FIGS. 8 and 9 may be arranged along a virtual line passing the first center O1 in the x direction or the y direction and may be curved to have a certain radius of curvature The first through-hole TH1 of FIGS. 8 and 9 may include the side edge E1 between adjacent corner parts, and the side edge E1 may be largely curved and may include an uneven part (e.g., locally irregular unevenness) as described above with reference to FIG. 6. While the side edge E1 of the first through-hole TH1 illustrated in FIG. 9 may be largely curved, a degree of curve, for example, a radius of curvature, may be less than a radius of curvature of the side edge E1 of the first through-hole TH1 of FIG. 8.

While the side edge E1 of the first through-hole TH1 of FIGS. 8 and 9 includes locally irregular unevenness, in another embodiment, referring to FIG. 10, the side edge E1 of the first through-hole TH1 may include a smooth curve in plan view. The corner edge CE1 of each corner part of the first through-hole TH1 may also include a smooth curve similar to the side edge E1.

The side edge E2 and/or a corner edge CE2 of the second through-hole TH2 may include an uneven part (e.g., irregular unevenness), as illustrated in FIGS. 8 and 9, or may include a smooth curve as illustrated in FIG. 10.

Figure 11:
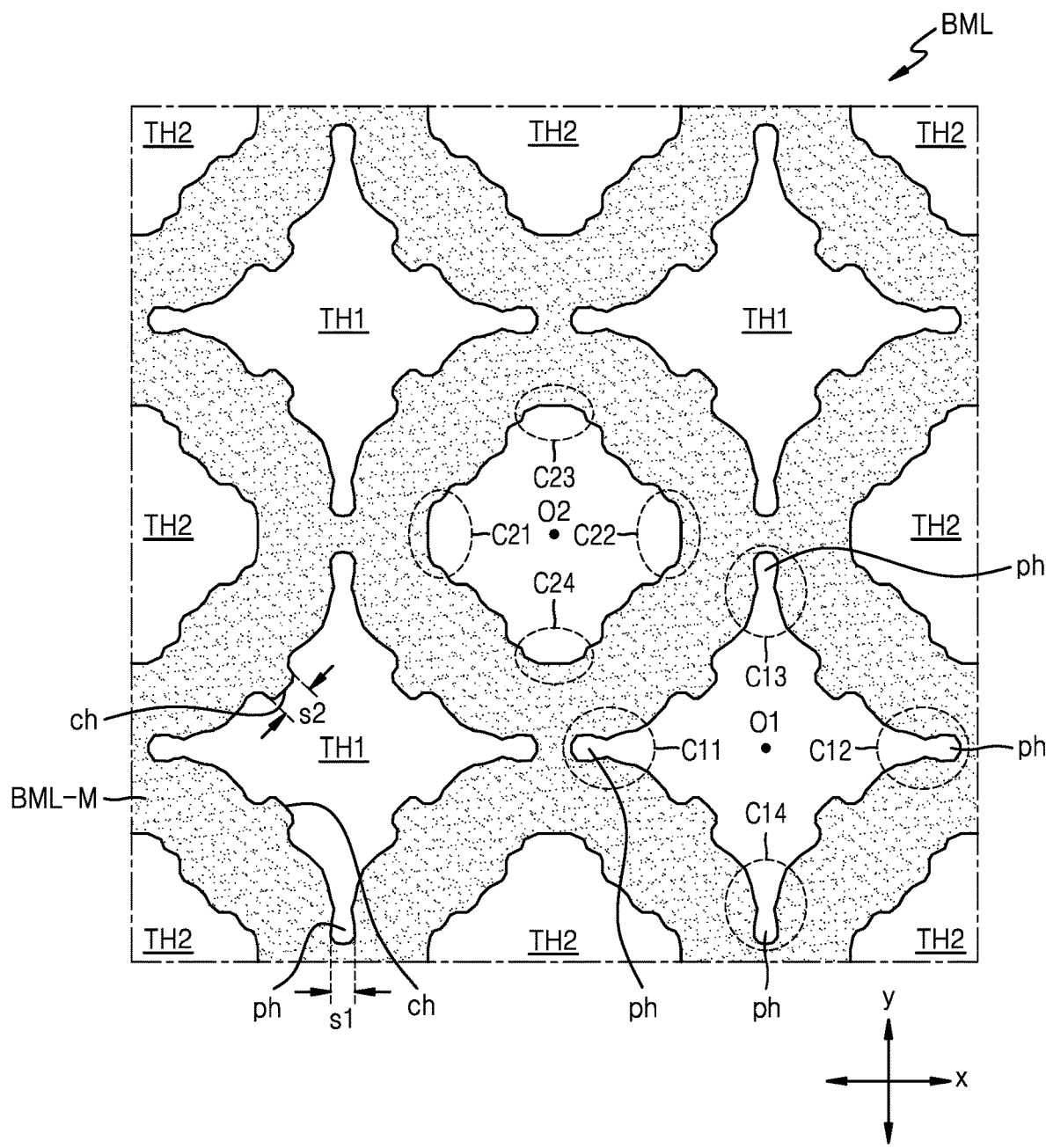
FIG. 11 is a schematic plan view of an excerpt of a metal layer of a display device according to an embodiment of the disclosure.
Figure 12:
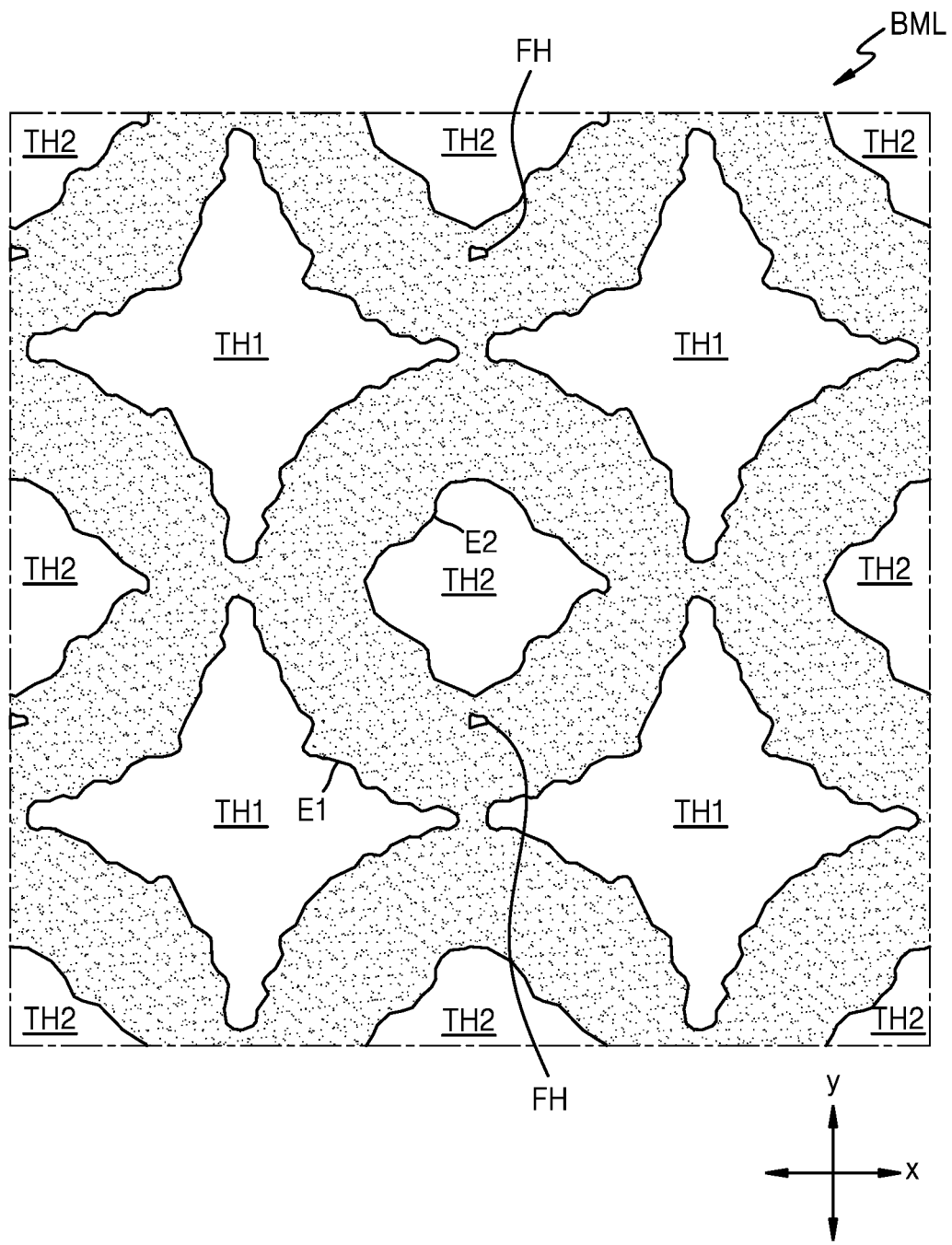
FIG. 12 is a schematic plan view of an excerpt of a metal layer of a display device according to an embodiment of the disclosure.

FIGS. 11 and 12 are schematic plan views of excerpts of a metal layer of a display device according to an embodiment of the disclosure.

Referring to FIG. 11, the back metal layer BML may include the first through-hole TH1 and the second through-hole TH2 having different shapes and/or sizes. Features regarding the metal part BML-M of the back metal layer BML and the structure and arrangement of the first through-hole TH1 and the second through-hole TH2 may be the same as those described with reference to FIGS. 6 and 7.

Each of the first to fourth corner parts C11, C12, C13, and C14 of the first through-hole TH1 may include a fine protruding portion ph, and the side edge E1 of the first through-hole TH1 may include a fine concave portion ch. The fine concave portion ch of the first through-hole TH1 may be a fine protrusion of the metal part BML-M of the back metal layer BML. As the first through-hole TH1 may be defined by an edge of the metal part BML-M, a fine protrusion of the metal part BML-M may be the fine concave portion ch of the first through-hole TH1. The term "fine" in the fine protruding portion ph and the fine concave portion ch may mean that the diameter or width of the fine protruding portion ph and the diameter or width of the fine concave portion ch may be less about ten times or more than the width of the first through-hole TH1 or the width of the second through-hole TH2. For example, a diameter or width s1 of the fine protruding portion ph and a diameter or width s2 of the fine concave portion ch may be about 1 μm to about 20 μm.

The second through-hole TH2 may include the fifth to eighth corner parts C21, C22, C23, and C24, and the second through-hole TH2, as illustrated in FIG. 11, unlike the first through-hole TH1, may not include a fine concave portion and/or a fine protruding portion. In another embodiment, the second through-hole TH2, similar to the first through-hole TH1, may include a fine concave portion and/or a fine protruding portion.

The second through-hole TH2, as illustrated in FIG. 11, may have a structure of a left-right symmetry and/or an up-down symmetry with respect to a line passing the second center O2 as a center. As another example, the second through-hole TH2, as illustrated in FIG. 12, may not have a structure of a left-right symmetry and/or an up-down symmetry.

The metal part BML-M of the back metal layer BML may be between the first through-hole TH1 and the second through-hole TH2, as illustrated in FIGS. 11 and 12, and the metal part BML-M of the back metal layer BML may include a fine hole FH. The fine hole FH may be between the first through-hole TH1 and the second through-hole TH2. Although FIG. 12 illustrates that the fine hole FH may be located adjacent to each of the corner part of the first through-hole TH1 and the corner part of the second through-hole TH2, in another embodiment, the fine hole FH may be between the side edge E1 of the first through-hole TH1 and the side edge E2 of the second through-hole TH2.

The term "fine" in the fine hole FH may mean that the diameter or width of the fine hole FH may be less about ten times or more, particularly, about twenty times or more, than the width of the first through-hole TH1 or the width of the second through-hole TH2. For example, the diameter or width of the fine hole FH may be about 1 μm to about 10 μm.

Figure 13:
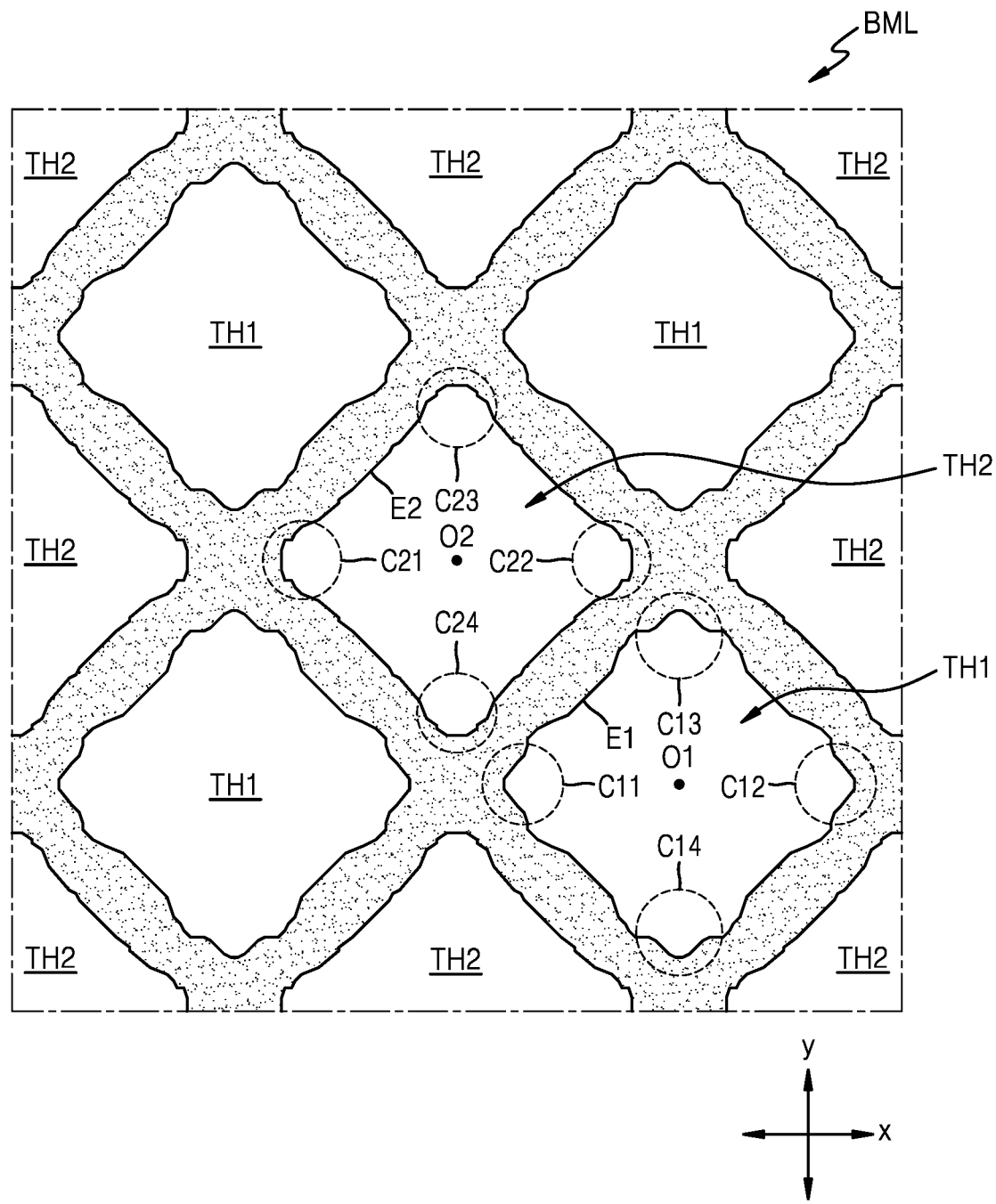
FIG. 13 is a schematic plan view of an excerpt of a metal layer of a display device according to an embodiment of the disclosure.
Figure 14:
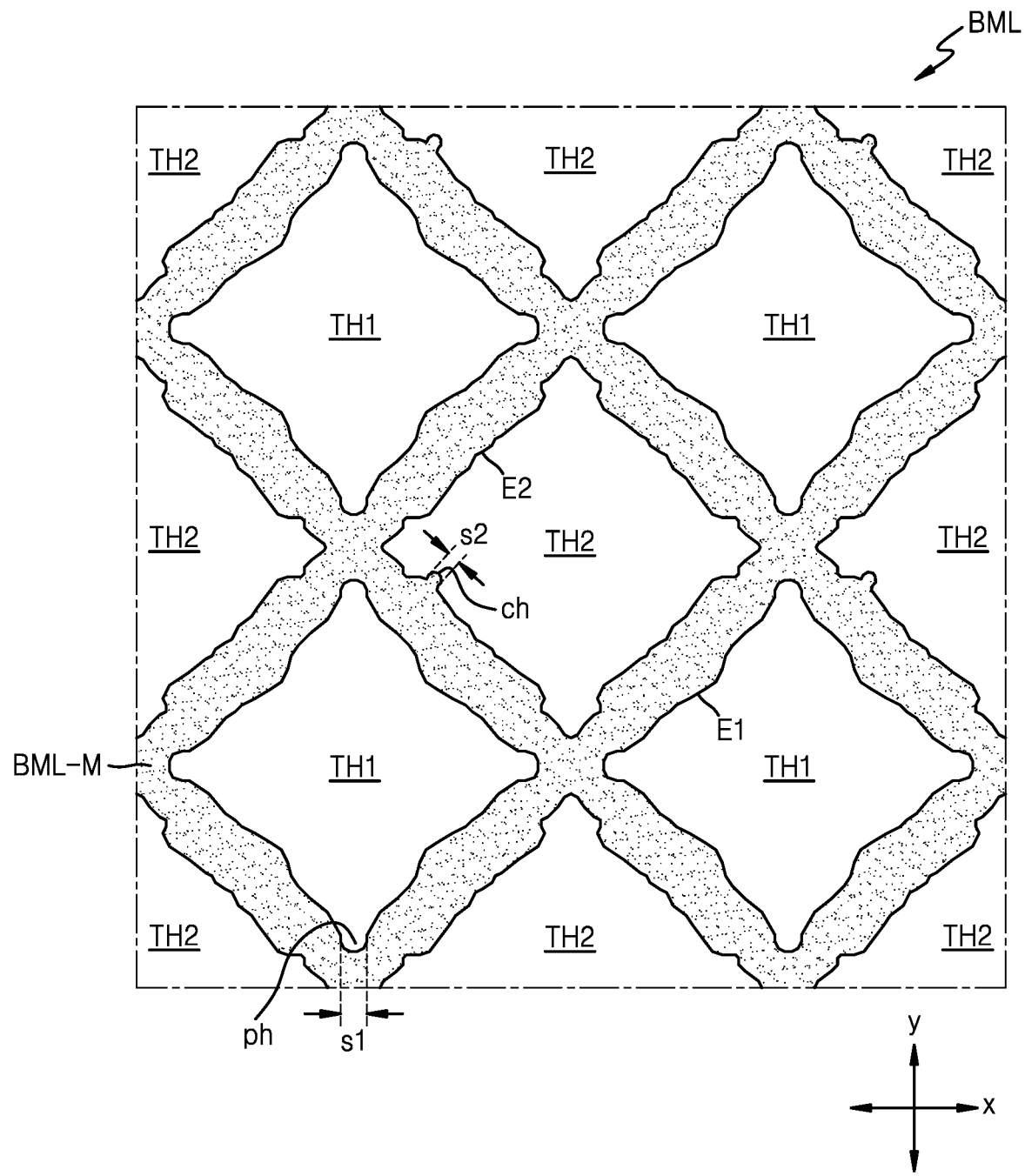
FIG. 14 is a schematic plan view of an excerpt of a metal layer of a display device according to an embodiment of the disclosure.
Figure 15:
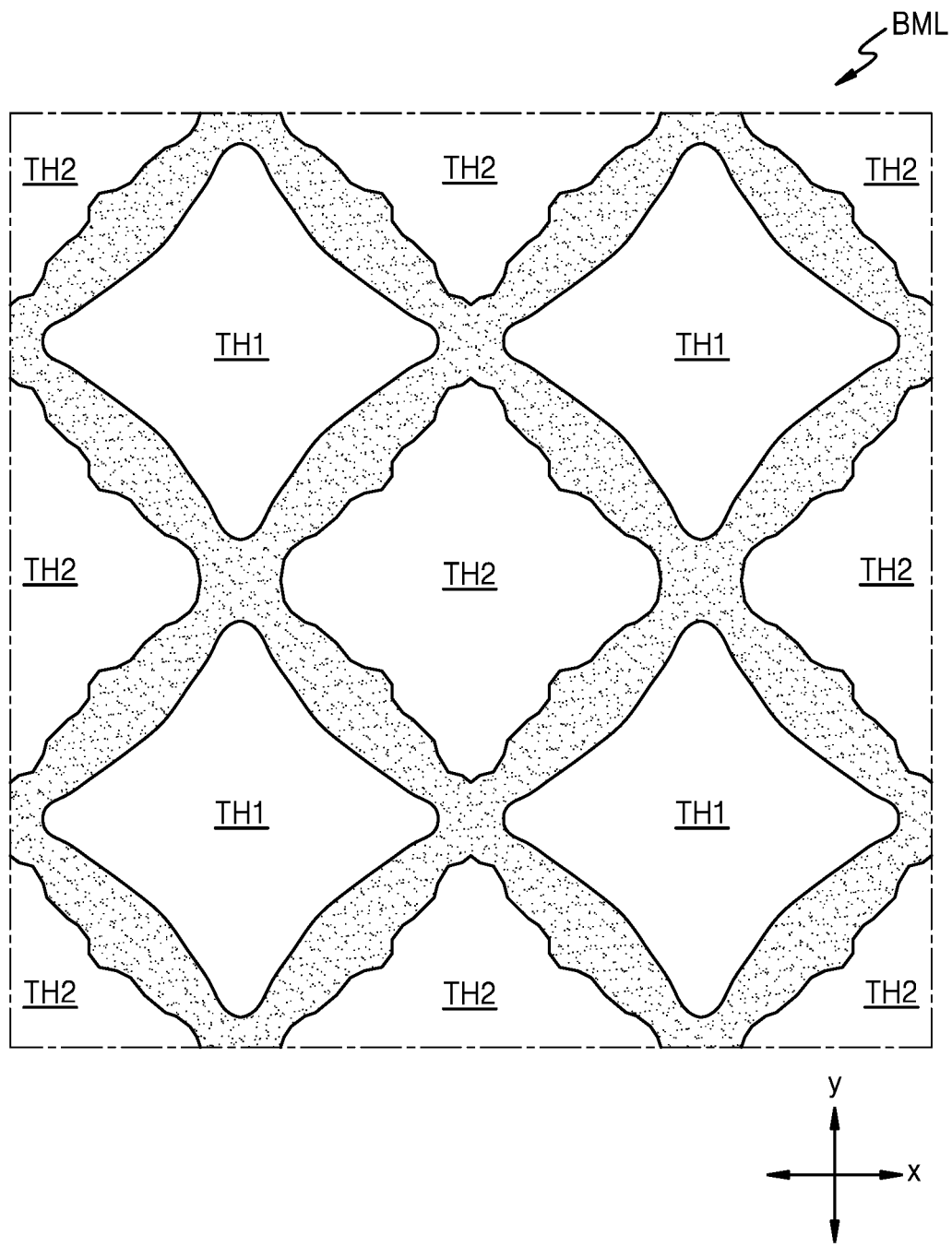
FIG. 15 is a schematic plan view of an excerpt of a metal layer of a display device according to an embodiment of the disclosure.

FIGS. 13 to 15 each are a schematic plan view of an excerpt of a metal layer of a display device according to an embodiment of the disclosure.

Referring to FIGS. 13 and 14, the back metal layer BML may include the first through-hole TH1 and the second through-hole TH2 having different shapes and/or sizes. The features regarding the metal part BML-M of the back metal layer BML and the structure and arrangement of the first through-hole TH1 and the second through-hole TH2 may be the same as those described with reference to FIGS. 6 and 7. In the embodiments described with reference to FIG. 6 to FIG. 12, the first through-hole TH1 may be approximately a cross type, whereas the first through-hole TH1 of FIGS. 13 to 15 may be approximately a rhombus type.

Referring to FIG. 13, the first through-hole TH1 may include the first to fourth corner parts C11, C12, C13, and C14, which may be disposed in the left, right, up, and down directions from the first center O1, and the second through-hole TH2 may include the fifth to eighth corner parts C21, C22, C23, and C24, which may be disposed in the left, right, up, and down directions from the second center O2. The first through-hole TH1 and the second through-hole TH2 may be disposed neighboring each other. For example, as described above, the side edge E1 of the first through-hole TH1 and the side edge E2 of the second through-hole TH2 may be disposed adjacent to each other, and the corner parts of the first through-hole TH1 and the corner parts of the second through-hole TH2 may be disposed adjacent to each other.

In the first through-hole TH1 and the second through-hole TH2 of FIG. 14, as described above with reference to FIG. 13, each may include corner parts, and at least one of the first through-hole TH1 and the second through-hole TH2 may include a fine protruding portion and/or a concave portion.

In an embodiment, as illustrated in FIG. 14, the first through-hole TH1 may include the fine protruding portion ph located at the corner part, and the second through-hole TH2 may include the concave portion (hereinafter, the fine concave portion ch) located at the side edge E2. The fine concave portion ch of the second through-hole TH2 may be a portion of the metal part BML-M of the back metal layer BML protruding toward the second through-hole TH2, as described above. The diameter or width s1 of the fine protruding portion ph and the diameter or width s2 of the fine concave portion ch may be selected within a range of about 1 µm to about 20 µm.

Although FIG. 14 illustrates that the side edge E1 of the first through-hole TH1 and the side edge E2 of the second through-hole TH2 each include an uneven part (e.g., irregular unevenness), in another embodiment, at least one of the side edge E1 of the first through-hole TH1 and the side edge E2 of the second through-hole TH2 may include a smooth curve. In an embodiment, FIG. 15 illustrates that the side edge E1 of the first through-hole TH1 includes a smooth curve and the side edge E2 of the second through-hole TH2 includes an uneven part (e.g., irregular unevenness).

Figure 16:
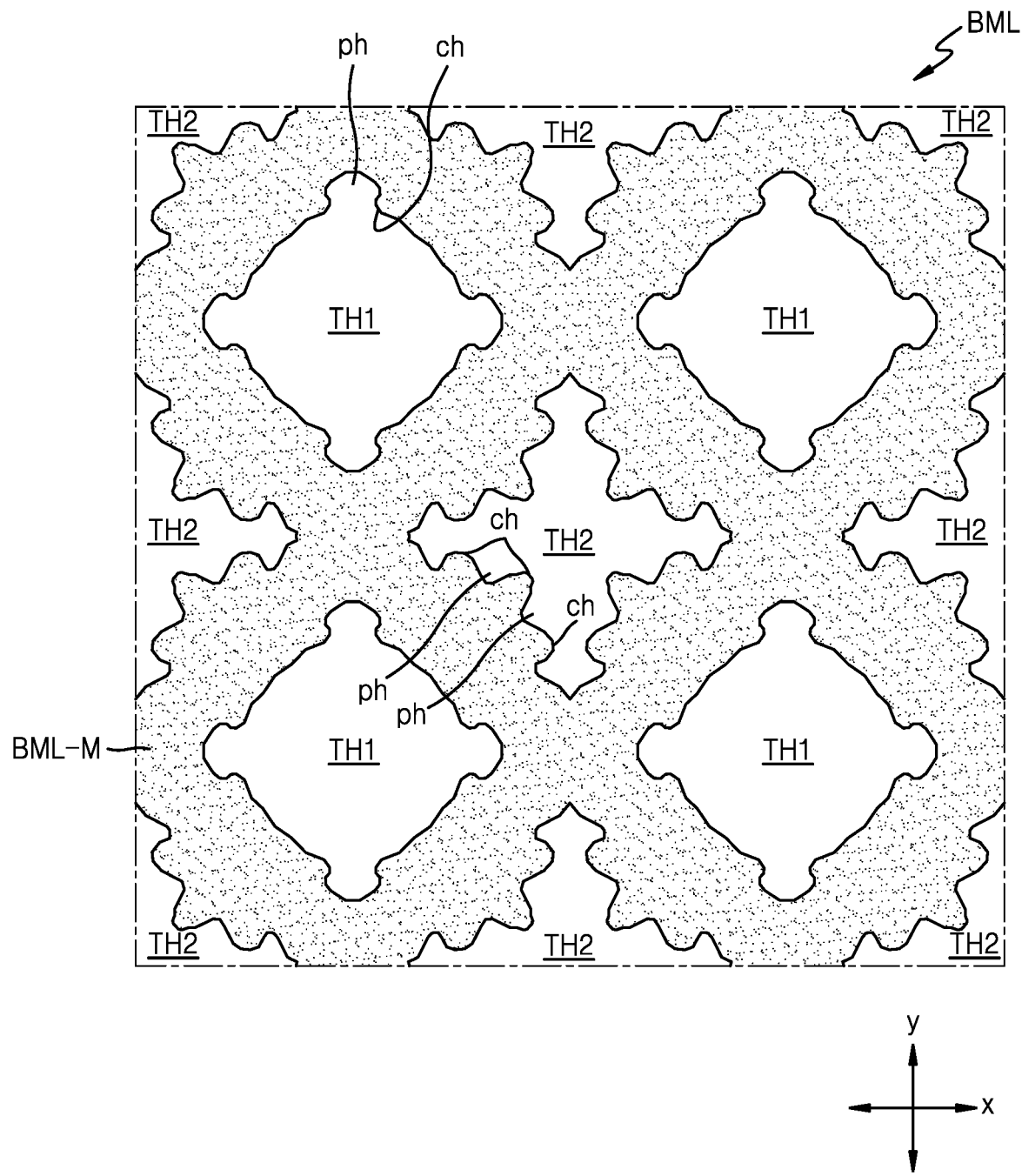
FIG. 16 is a schematic plan view of an excerpt of a metal layer of a display device according to an embodiment of the disclosure.
Figure 17:
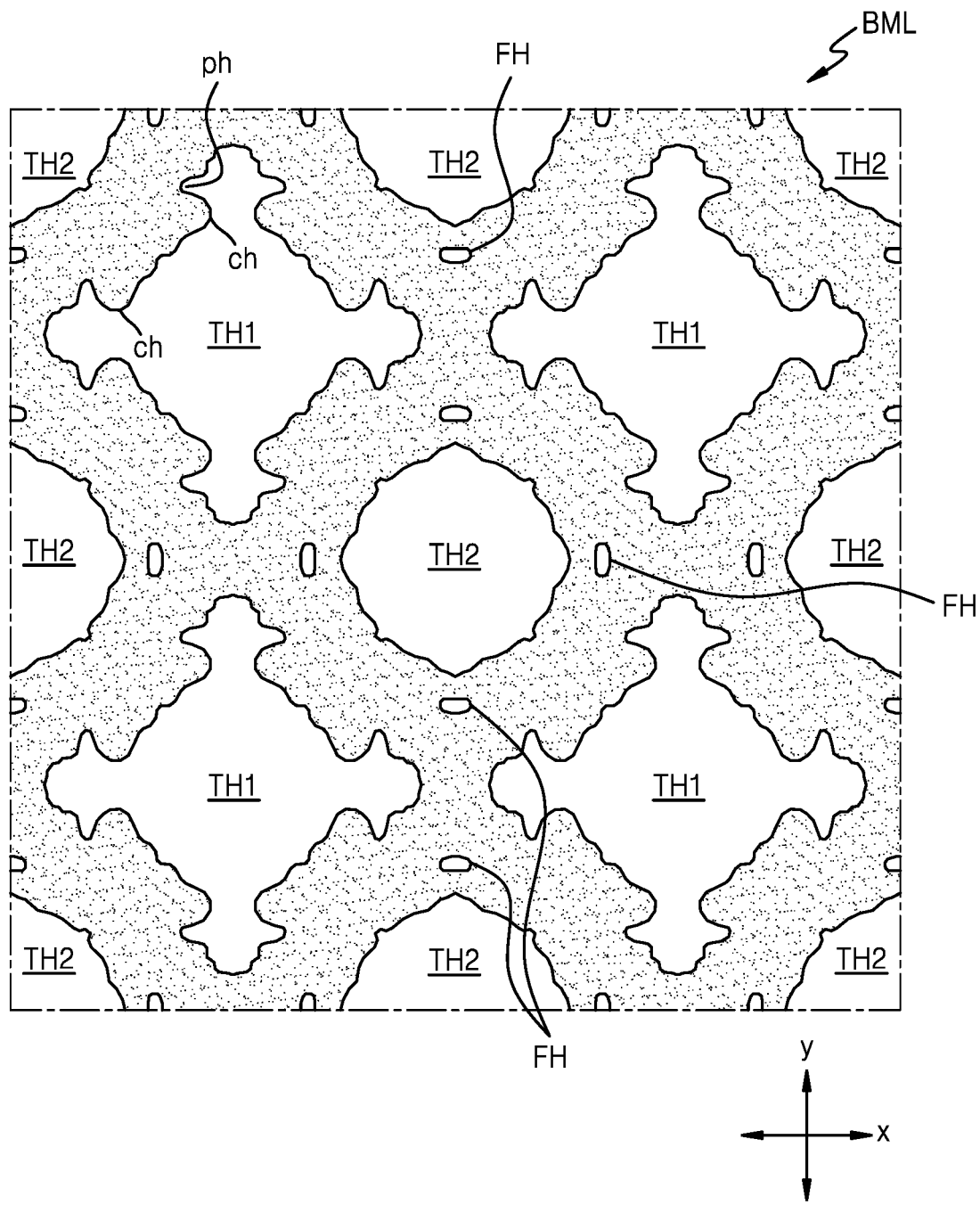
FIG. 17 is a schematic plan view of an excerpt of a metal layer of a display device according to an embodiment of the disclosure.
Figure 18:
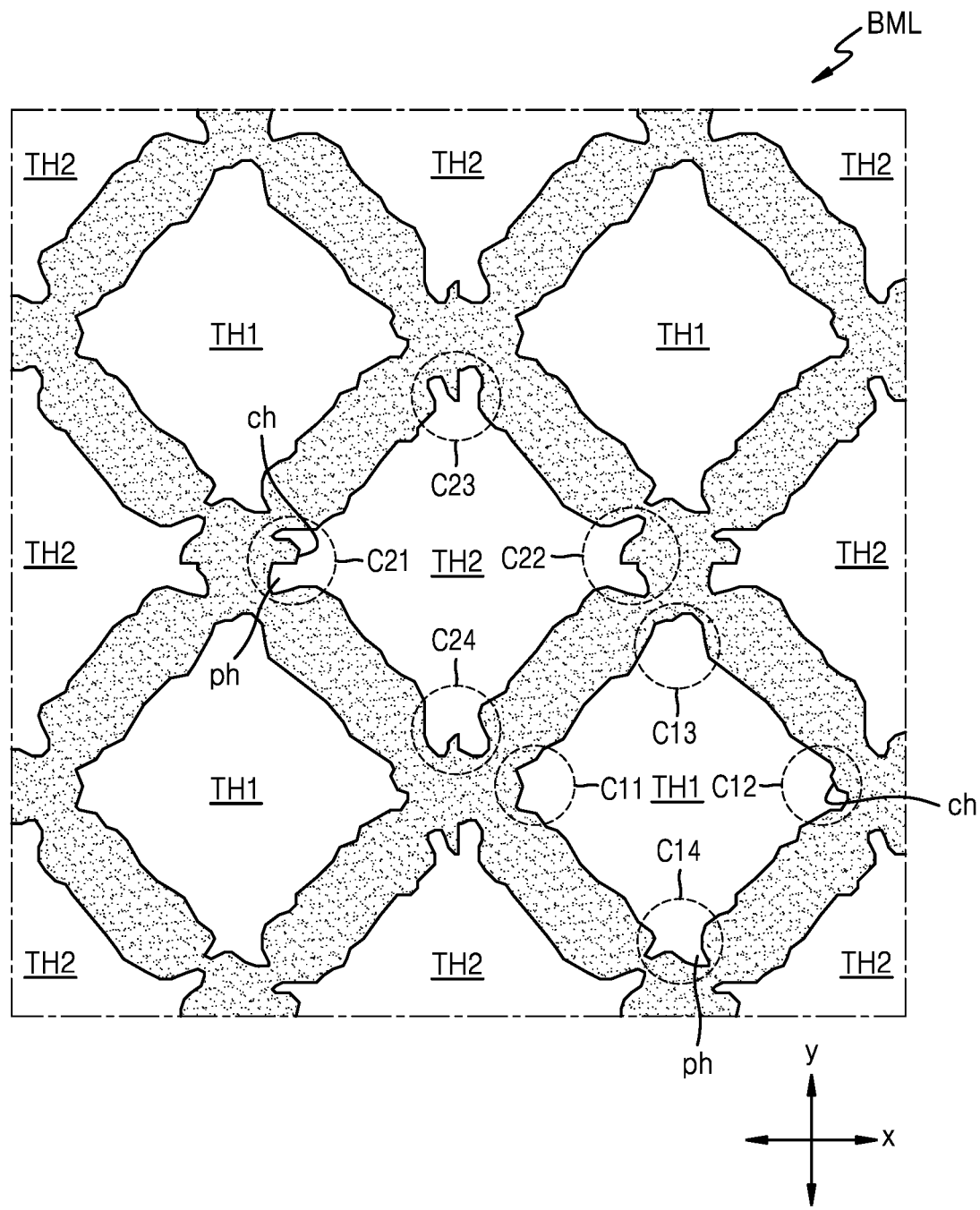
FIG. 18 is a schematic plan view of an excerpt of a metal layer of a display device according to an embodiment of the disclosure.

FIGS. 16 to 18 are schematic plan views of an excerpt of a metal layer of a display device according to an embodiment of the disclosure.

Referring to FIGS. 16 and 17, the first through-hole TH1 and/or the second through-hole TH2 may include the fine protruding portion ph and the fine concave portion ch.

Referring to FIGS. 16 and 17, the corner parts of the first through-hole TH1 may include the fine protruding portion ph and the fine concave portion ch, and the second through-hole TH2 may include the fine protruding portion ph and the fine concave portion ch. The side edge E2 of the second through-hole TH2, as illustrated in FIG. 16, may include fine protruding portions as the fine protruding portion ph and the fine concave portion ch between the neighboring fine protruding portions ph.

The fine hole FH may be disposed between the first through-hole TH1 and the second through-hole TH2, as illustrated in FIG. 17. For example, the fine hole FH may be disposed adjacent to each of the four corner parts of the second through-hole TH2.

In FIGS. 16 and 17, the first through-hole TH1 and the second through-hole TH2 may have a left-right symmetry and/or an up-down symmetry with respect to each center. In another embodiment, referring to FIG. 18, the first through-hole TH1 and the second through-hole TH2 may not have a left-right symmetry and/or an up-down symmetry with respect to each center. For example, the shapes of at least two corner parts selected from the first to fourth corner parts C11, C12, C13, and C14 of the first through-hole TH1 may be different from one another.

In an embodiment, as illustrated in FIG. 18, the shapes of the first to fourth corner parts C11, C12, C13, and C14 of the first through-hole TH1 may be different from one another. Although each of the first to fourth corner parts C11, C12, C13, and C14 may include the fine protruding portion ph and/or the fine concave portion ch, specific arrangements, locations, and/or widths thereof may be different from one another, and accordingly, the shapes of the first to fourth corner parts C11, C12, C13, and C14 may be different from one another.

Similarly, the shapes of the fifth to eighth corner parts C21, C22, C23, and C24 of the second through-hole TH2 may be different from one another. One or more of the fifth to eighth corner parts C21, C22, C23, and C24 may include the fine protruding portion ph and/or the fine concave portion ch. The shapes of the fifth to eighth corner parts C21, C22, C23, and C24 may be different from one another according to whether the fifth to eighth corner parts C21, C22, C23, and C24 include the fine protruding portion ph and the fine concave portion ch, or according to a specific arrangement in case the fifth to eighth corner parts C21, C22, C23, and C24 include the fine protruding portion ph or the fine concave portion ch.

According to the embodiments described with reference to FIGS. 6 to 18, the side edge E1 of the first through-hole TH1 and the side edge E2 of the second through-hole TH2 may be disposed adjacent to each other, and the corner parts of the first through-hole TH1 and the corner parts of the second through-hole TH2 may be disposed adjacent to each other. However, the disclosure is not limited thereto. In another embodiment, in the first through-hole TH1 and the second through-hole TH2, the side edge E1 of the first through-hole TH1 and the corner parts of the first through-hole TH1 may be disposed adjacent to each other.

Figure 19:
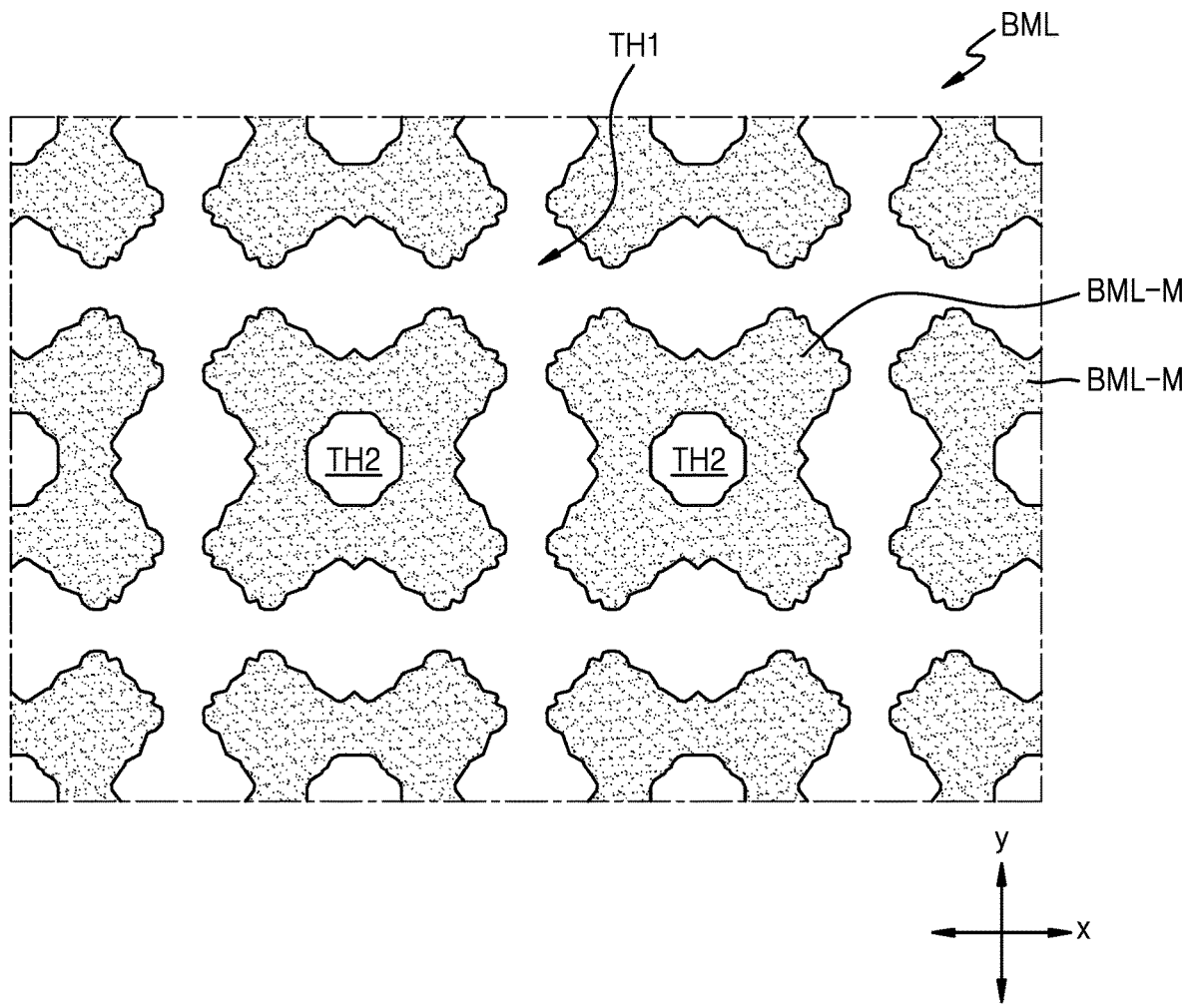
FIG. 19 is a schematic plan view of an excerpt of a metal layer of a display device according to an embodiment of the disclosure.

FIG. 19 is a schematic plan view of an excerpt of a metal layer of a display device according to an embodiment of the disclosure.

According to the embodiments described with reference to FIGS. 6 to 18, the first through-holes TH1 apart from each other may be arranged to surround the second through-hole TH2, but the disclosure is not limited thereto. Referring to FIG. 19, the second through-hole TH2 may be entirely surrounded by the first through-hole TH1.

The first through-hole TH1 may have a mesh structure extending in the first direction, for example, the y direction, and the second direction, for example, the x direction, and multiple metal parts BML-M may be spaced apart from each other in an island type. The second through-hole TH2 may be apart from the first through-hole TH1 with the metal part BML-M therebetween, and the second through-hole TH2 may be disposed at a location corresponding to the center of the metal part BML-M. The side edge of each of the first through-hole TH1 and/or the second through-hole TH2 may have an uneven part (e.g., irregular unevenness), as described above.

The back metal layer BML having the structure according to the embodiments described with reference to FIGS. 6 to 19 may reduce or prevent diffraction of light incident on a component through the back metal layer BML.

A line spread function (LSF) may be checked by irradiating a line light source to the back metal layer BML having the above-described structure. In a graph regarding data related to the above-described LSF, for example, light intensity to a location, a ratio of the second peak to the first peak was searched for, and the value was found to be about 5% or less, and thus it may be checked that the diffraction of light incident on a component through the back metal layer BML having the above-described structure may be reduced or prevented. It may be checked that the ratio of the second peak to the first peak of the LSF being about 5% or less may be about 50% when converted to a modulation transfer function (MTF).

Figure 20:
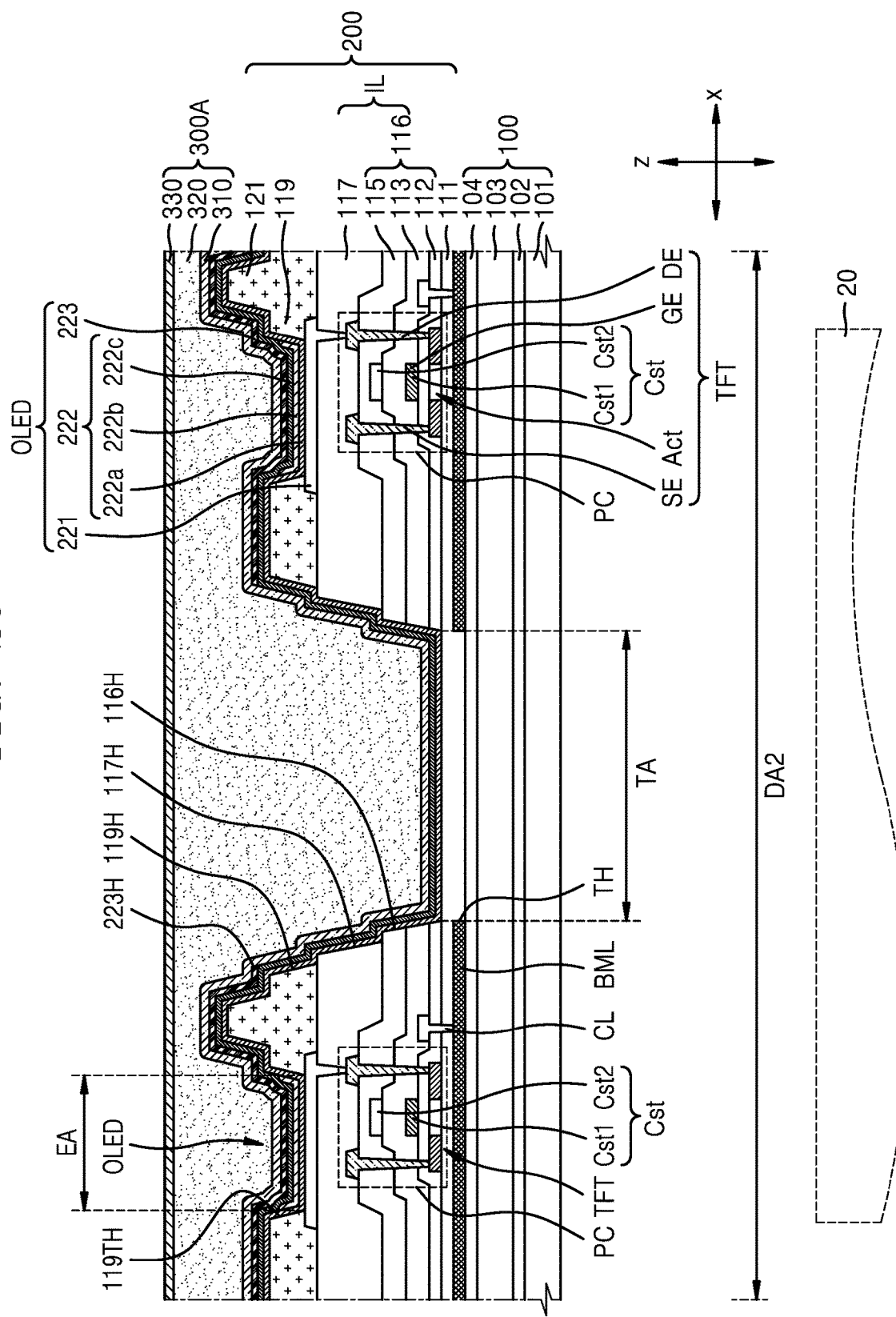
FIG. 20 is a schematic cross-sectional view of a part of a display device according to an embodiment of the disclosure.

FIG. 20 is a schematic cross-sectional view of a part of a display device according to an embodiment of the disclosure.

Referring to FIG. 20, the substrate 100 may have a multilayer structure. The substrate 100 may include the first base layer 101, the first barrier layer 102, the second base layer 103 and the second barrier layer 104, which may be sequentially stacked on each other, and detailed materials thereof may be the same as those described above with reference to FIG. 2D. Although FIG. 20 illustrates that the substrate 100 has the above-described multilayer structure, in another embodiment, the substrate 100 may be formed in a single layer like a glass material.

The buffer layer 111 may reduce or prevent the intrusion of foreign materials, moisture, or external air from the lower portion of the substrate 100 and may provide a planarized surface on the substrate 100. The buffer layer 111 may include an inorganic insulating material such as a silicon oxide, a silicon oxynitride, and a silicon nitride, and may have a single layer or multilayer structure including the above-described material.

The back metal layer BML may be disposed between the substrate 100 and the buffer layer 111. The back metal layer BML may include the through-hole TH corresponding to the transmission area TA. The back metal layer BML may include conductive metal such as aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu). The back metal layer BML may have a flat structure as described above with reference to FIGS. 6 to 19, and in FIG. 20, the through-hole TH of the back metal layer BML may correspond to the first through-hole TH1 or the second through-hole TH2, which is described with reference to FIGS. 6 to 19.

The back metal layer BML may be electrically connected to the connection line CL. The connection line CL may be electrically connected to a gate electrode, a source electrode, or a drain electrode of the thin film transistor TFT, or electrically connected to any one capacitor plate of the storage capacitor Cst that is described later. As another example, the connection line CL may be electrically connected to the driving voltage line PL of FIG. 4. The back metal layer BML may be electrically connected by the connection line CL to the gate electrode, the source electrode, or the drain electrode of the thin film transistor TFT, to any one capacitor plate of the storage capacitor Cst, or to the driving voltage line PL. The back metal layer BML connected to the connection line CL may protect the thin film transistor TFT from the external static electricity or enhance the performance of the thin film transistor TFT.

The pixel circuit PC including the thin film transistor TFT and the storage capacitor Cst may be disposed on the buffer layer 111. The thin film transistor TFT may include the semiconductor layer Act, the gate electrode GE overlapping a channel region of the semiconductor layer Act, and the source electrode SE and the drain electrode DE respectively connected to a source region and a drain region of the semiconductor layer Act. A gate insulating layer 112 may be provided between the semiconductor layer Act and the gate electrode GE, and a first interlayer insulating layer 113 and a second interlayer insulating layer 115 may be disposed between the gate electrode GE and the source electrode SE or between the gate electrode GE and the drain electrode DE.

The storage capacitor Cst may be disposed overlapping the thin film transistor TFT. The storage capacitor Cst may include a first capacitor plate Cst1 and a second capacitor plate Cst2 that overlap each other. In some embodiments, the gate electrode GE of the thin film transistor TFT may include the first capacitor plate Cst1 of the storage capacitor Cst. The first interlayer insulating layer 113 may be disposed between the first capacitor plate Cst1 and the second capacitor plate Cst2.

The semiconductor layer Act may include polysilicon. In some embodiments, the semiconductor layer Act may include amorphous silicon. In some embodiments, the semiconductor layer Act may include an oxide of at least one material selected from the group consisting of indium (In), gallium (Ga), stannum (Sn), zirconium (Zr), vanadium (V), hafnium (Hf), cadmium (Cd), germanium (Ge), Cr, Ti, and zinc (Zn). The semiconductor layer Act may include the channel region, and the source region and the drain region where impurities may be doped.

The gate insulating layer 112 may include an inorganic insulating material such as a silicon oxide, a silicon oxynitride, and a silicon nitride, and may have a single layer or multilayer structure including the above-described material.

The gate electrode GE or the first capacitor plate Cst1 may include a low resistance conductive material such as Mo, Al, Cu, and/or Ti, and may have a single layer or multilayer structure having the above-described material.

The first interlayer insulating layer 113 may include an inorganic insulating material such as a silicon oxide, a silicon oxynitride, and a silicon nitride, and may have a single layer or multilayer structure including the above-described material.

The second capacitor plate Cst2 may include Al, Pt, Pd, Ag, Mg, Au, Ni, Nd, Ir, Cr, Ca, Mo, Ti, W, and/or Cu, and may have a single layer or multilayer structure including the above-described material.

The second interlayer insulating layer 115 may include an inorganic insulating material such as a silicon oxide, a silicon oxynitride, and a silicon nitride, and may have a single layer or multilayer structure including the above-described material.

The source electrode SE or the drain electrode DE may include Al, Pt, Pd, Ag, Mg, Au, Ni, Nd, Ir, Cr, Ca, Mo, Ti, W, and/or Cu, and may have a single layer or multilayer structure including the above-described material. For example, the source electrode SE or the drain electrode DE may have a triple layer structure of a titanium layer/an aluminum layer/a titanium layer.

A planarization insulating layer 117 may include a material that may be different from the material of at least one inorganic insulating layer 116 disposed under the planarization insulating layer 117, for example, the gate insulating layer 112, the first interlayer insulating layer 113, and the second interlayer insulating layer 115. The planarization insulating layer 117 may include an organic insulating material such as acryl, benzocyclobutene (BCB), polyimide, hexamethyldisiloxane (HMDSO), or a combination thereof.

A pixel electrode 221 may be formed on the planarization insulating layer 117. The pixel electrode 221 may be electrically connected to the thin film transistor TFT via a contact hole formed in the planarization insulating layer 117.

The pixel electrode 221 may include a reflective film including Ag, Mg, Al, Pt, Pd, Au, Ni, Nd, Ir, Cr, or a compound thereof. The pixel electrode 221 may include the reflective film including the above-described material and a transparent conductive film disposed above and/or below the reflective film. The transparent conductive film may include indium tin oxide (ITO), indium zinc oxide (IZO), zinc oxide (ZnO), indium oxide ($In_2O_3$), indium gallium oxide (IGO), aluminum zinc oxide (AZO), or a combination thereof. In an embodiment, the pixel electrode 221 may have a tri-layer structure of an ITO layer/an Ag layer/an ITO layer that may be sequentially stacked on each other.

A pixel defining film 119 may cover the edge of the pixel electrode 221, and may include a through-hole 119TH that exposes the center of the pixel electrode 221. The pixel defining film 119 may include an organic insulating material such as BCB, polyimide, HMDSO, or a combination thereof. The through-hole 119TH of the pixel defining film 119 may define an emission area EA, and red, green, or blue light may be emitted through the emission area EA. The area or width of the emission area EA may define the area or width of a pixel.

A spacer 121 may be formed on the pixel defining film 119. The spacer 121 may prevent layers below the spacer 121 from being damaged by a mask in a process of forming an intermediate layer 222 that is described later. The spacer 121 and the pixel defining film 119 may include a same material.

The intermediate layer 222 may include a light-emitting layer 222b overlapping the pixel electrode 221. The light-emitting layer 222b may include an organic material. The light-emitting layer 222b may include a polymer organic material or a low molecular weight organic material that emits light of a certain color. The light-emitting layer 222b may be formed through a deposition process using a mask, as described above.

A first functional layer 222a and a second functional layer 222c may be disposed above and/or below the light-emitting layer 222b.

The first functional layer 222a may be a single layer or multilayer. For example, in case the first functional layer 222a may be formed of a polymer material, the first functional layer 222a may be formed of poly-(3,4)-ethylenedihydroxy thiophene (PEDOT) or polyaniline (PANI), as a hole transport layer (HTL) that may be a single layer structure. In case the first functional layer 222a may be formed of a low molecular weight material, the first functional layer 222a may include a hole injection layer (HIL) and the HTL.

The second functional layer 222c may be optional. For example, in case the first functional layer 222a and the light-emitting layer 222b may be formed of a polymer material, the second functional layer 222c may be formed. The second functional layer 222c may be a single layer or multilayer. The second functional layer 222c may include an electron transport layer (ETL) and/or an electron injection layer (EIL).

Each of the first functional layer 222a and the second functional layer 222c may be formed as a single body to largely cover the display area. As illustrated in FIG. 20, the first functional layer 222a and the second functional layer 222c may be integrally formed across the display area.

A counter electrode 223 may be formed of a conductive material having a relatively low work function. For example, the counter electrode 223 may include a (semi-) transparent layer including Ag, Mg, Al, Ni, Cr, lithium (Li), Ca, or an alloy thereof. As another example, the counter electrode 223 may further include a layer such as ITO, IZO, ZnO, or $In_2O_3$ on the (semi-) transparent layer including the above-described material. In an embodiment, the counter electrode 223 may include Ag, Mg, or a combination thereof. The counter electrode 223 may include a fourth hole 223H located in the transmission area TA, and may be integrally formed across the display area.

A stack structure of the pixel electrode 221, the intermediate layer 222, and the counter electrode 223, which may be sequentially stacked on each other, may form a light-emitting diode, for example, the organic light-emitting diode OLED. The display layer 200 including the pixel circuit PC, the insulating layers, and the organic light-emitting diode OLED may be covered by the thin film encapsulation layer 300A.

The thin film encapsulation layer 300A may include the organic encapsulation layer 320 between the first and second inorganic encapsulation layers 310 and 330.

The first and second inorganic encapsulation layers 310 and 330 each may include one or more inorganic insulating materials. The inorganic insulating material may include aluminum oxide, titanium oxide, tantalum oxide, hafnium oxide, zinc oxide, silicon oxide, silicon nitride, and/or silicon oxynitride. The first and second inorganic encapsulation layers 310 and 330 may be formed by a chemical vapor deposition method.

The organic encapsulation layer 320 may include a polymer-based material. The polymer-based material may include acryl-based resin, epoxy-based resin, polyimide, polyethylene, or a combination thereof. For example, the organic encapsulation layer 320 may include acryl-based resin, for example, polymethyl methacrylate or polyacryl acid. The organic encapsulation layer 320 may be formed by curing a monomer or coating a polymer.

As the second display area DA2 may include the transmission area TA, FIG. 20 illustrates that two pixel circuits PC and two organic light-emitting diodes OLED may be disposed adjacent to each other with the transmission area TA therebetween.

The insulating layer IL on the substrate 100, for example, at least one of the inorganic insulating layer 116 and the planarization insulating layer 117, and the pixel defining film 119 may include a hole corresponding to the transmission area TA. At least one inorganic insulating layer 116 may include any one or more selected from the gate insulating layer 112, the first interlayer insulating layer 113, and the second interlayer insulating layer 115.

At least one of a first hole 116H of the inorganic insulating layer 116, a second hole 117H of the planarization insulating layer 117, and a third hole 119H of the pixel defining film 119 may overlap each other in the transmission area TA. The counter electrode 223 may include the fourth hole 223H located in the transmission area TA, and the fourth hole 223H may overlap the first hole 116H, the second hole 117H, and the third hole 119H. The first hole 116H may have a shape of a through-hole that penetrates a stack body of the gate insulating layer 112, the first interlayer insulating layer 113, and the second interlayer insulating layer 115 or a shape of a blind-hole in which the above-described stack body may be partially removed in a thickness direction. Each of the second hole 117H, the third hole 119H, and the fourth hole 223H may have the shape of a through-hole.

Each of the buffer layer 111 and the second barrier layer 104 may not include a hole located in the transmission area TA. For example, as illustrated in FIG. 20, the buffer layer 111 and the second barrier layer 104 may cover the transmission area TA. In some embodiments, the buffer layer 111 and/or the second barrier layer 104 may include a hole located in the transmission area TA.

The sizes or widths of the first hole 116H, the second hole 117H, the third hole 119H, and the fourth hole 223H may be different from each other. Although FIG. 20 illustrates that the width of the first hole 116H may be substantially the same as the width of the through-hole TH of the back metal layer BML, the disclosure is not limited thereto. In another embodiment, the width of the first hole 116H may be greater or less than the width of the through-hole TH of the back metal layer BML.

Although FIG. 20 illustrates that the thin film encapsulation layer 300A may be disposed on the organic light-emitting diode OLED, in another embodiment, the encapsulation substrate 300B of FIG. 2C may be disposed on the organic light-emitting diode OLED. Although FIG. 20 illustrates a sectional structure in the second display area DA2, the organic light-emitting diode OLED and the pixel circuit PC electrically connected to the organic light-emitting diode OLED may be disposed in the first display area DA1, and the structure may be the same as the structure of the organic light-emitting diode OLED and the pixel circuit PC, which are described with reference to FIG. 20.

The embodiments of the disclosure may provide a display panel which may provide a high quality image, and the diffraction of light that a component receives may be prevented. The effect is exemplary, and the scope of the disclosure is not limited thereby.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, including any equivalents.

What is claimed is:

1. A display device comprising:
pixel circuits disposed on a substrate, each of the pixel circuits comprising a transistor and a storage capacitor;
display elements respectively electrically connected to the pixel circuits; and
a metal layer disposed between the substrate and the pixel circuits, the metal layer comprising through-holes, wherein
the through-holes of the metal layer comprise:
a first through-hole; and
second through-hole spaced apart from the first through-hole, and
the second through-hole is entirely surrounded by the first through-hole in a plan view.

2. The display device of claim 1, wherein the first through-hole or the second through-hole comprises an uneven side edge.

3. The display device of claim 1, wherein
the metal layer comprises a first metal part entirely surrounding the second through-hole, and
the first metal part has an isolated shape.

4. The display device of claim 3, wherein the first metal part overlaps at least one of the display elements.

5. The display device of claim 3, wherein the first metal part overlaps at least one of the pixel circuits.

6. The display device of claim 3, wherein
the metal layer further comprises a second metal part spaced apart from the first metal part, and
the second metal part has an isolated shape.

7. The display device of claim 6, wherein the metal layer further comprises a third through-hole entirely surrounded by the second metal part.

8. The display device of claim 6, wherein the metal layer further comprises a third through-hole entirely surrounded by the second metal part.

9. A display device comprising:
pixel circuits disposed on a substrate, each of the pixel circuits comprising a transistor and a storage capacitor;
display elements respectively electrically connected to the pixel circuits; and
a metal layer disposed between the substrate and the pixel circuits, the metal layer comprising through-holes, wherein the through-holes of the metal layer comprise a first through-hole having a mesh shape and metal parts separated from each other.

10. The display device of claim 9, wherein the metal layer further comprises second through-holes respectively disposed in the metal parts.

11. The display device of claim 10, wherein the first through-hole or the second through-hole comprises an uneven side edge.

12. The display device of claim 9, wherein at least one of the metal parts overlaps at least one of the display elements.

13. The display device of claim 9, wherein at least one of the metal parts overlaps at least one of the pixel circuits.

14. An electronic apparatus comprising:
a display device comprising at least one transmission area; and
a component disposed below the at least one transmission area, wherein
the display device comprises:
pixel circuits disposed on a substrate, each of the pixel circuits comprising a transistor and a storage capacitor;
display elements respectively electrically connected to the pixel circuits; and
a metal layer disposed between the substrate and the pixel circuits, the through-holes of the metal layer comprise:
a first through-hole; and
second through-hole spaced apart from the first through-hole, and
the second through-hole is entirely surrounded by the first through-hole in a plan view.

15. The display device of claim 14, wherein the first through-hole or the second through-hole comprises an uneven side edge.

16. The display device of claim 14, wherein
the metal layer comprises a first metal part entirely surrounding the second through-hole, and
the first metal part has an isolated shape.

17. The display device of claim 16, wherein the first metal part overlaps at least one of the display elements.

18. The display device of claim 16, wherein the first metal part overlaps at least one of the pixel circuits or at least one of the display elements.

19. The display device of claim 16, wherein
the metal layer further comprises a second metal part spaced apart from the first metal part, and
the second metal part has an isolated shape.

20. The display device of claim 19, wherein the metal layer further comprises a third through-hole entirely surrounded by the second metal part.

* * * * *